US009047985B2

(12) United States Patent
Lemke et al.

(10) Patent No.: US 9,047,985 B2
(45) Date of Patent: Jun. 2, 2015

(54) APPARATUS, STORAGE DEVICE, SWITCH AND METHODS, WHICH INCLUDE MICROSTRUCTURES EXTENDING FROM A SUPPORT

(71) Applicant: Infineon Technologies Dresden GmbH, Dresden (DE)

(72) Inventors: Marko Lemke, Dresden (DE); Stefan Tegen, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 258 days.

(21) Appl. No.: 13/656,631

(22) Filed: Oct. 19, 2012

(65) Prior Publication Data
US 2014/0112067 A1    Apr. 24, 2014

(51) Int. Cl.
| G11C 11/50 | (2006.01) |
| G11C 23/00 | (2006.01) |
| B82Y 10/00 | (2011.01) |
| G11C 13/02 | (2006.01) |

(52) U.S. Cl.
CPC ............... *G11C 23/00* (2013.01); *B82Y 10/00* (2013.01); *G11C 13/025* (2013.01)

(58) Field of Classification Search
USPC ................................................. 365/164, 129
See application file for complete search history.

(56) References Cited

U.S. PATENT DOCUMENTS

| 5,966,066 | A | 10/1999 | Mehregany et al. |
| 6,456,190 | B1 | 9/2002 | Andersson et al. |
| 6,625,047 | B2 * | 9/2003 | Coleman, Jr. ................... 365/51 |
| 7,352,607 | B2 | 4/2008 | Furukawa et al. |
| 7,821,821 | B2 * | 10/2010 | Lee et al. ....................... 365/164 |
| 8,045,171 | B2 * | 10/2011 | Murakami et al. ............. 356/445 |
| 8,213,004 | B2 * | 7/2012 | Naya et al. .................... 356/301 |
| 2010/0215543 | A1 | 8/2010 | Henry et al. |
| 2011/0181150 | A1 | 7/2011 | Mahameed et al. |

FOREIGN PATENT DOCUMENTS

DE         69829990 T2      5/2006

OTHER PUBLICATIONS

Grinthal, A., et al., "Steering nanofibers: An integrative approach to bio-inspired fiber fabrication and assembly," Nano Today, Feb. 2012, pp. 35-52, vol. 7, Issue 1, Elsevier.

* cited by examiner

*Primary Examiner* — Pho M Luu
(74) *Attorney, Agent, or Firm* — Slater & Matsil, L.L.P.

(57) ABSTRACT

An apparatus has a support and a plurality of bendable and conductive microstructures extending from the support. Two adjacent microstructures of the plurality of microstructures define a detectable first state if they are not bent such that end portions thereof, which are distal with respect to the support, do not touch each other, and the two adjacent microstructures of the plurality of microstructures define a detectable second state if they are bent such that the end portions thereof, which are distal with respect to the support, touch each other and are fixed to each other.

21 Claims, 21 Drawing Sheets

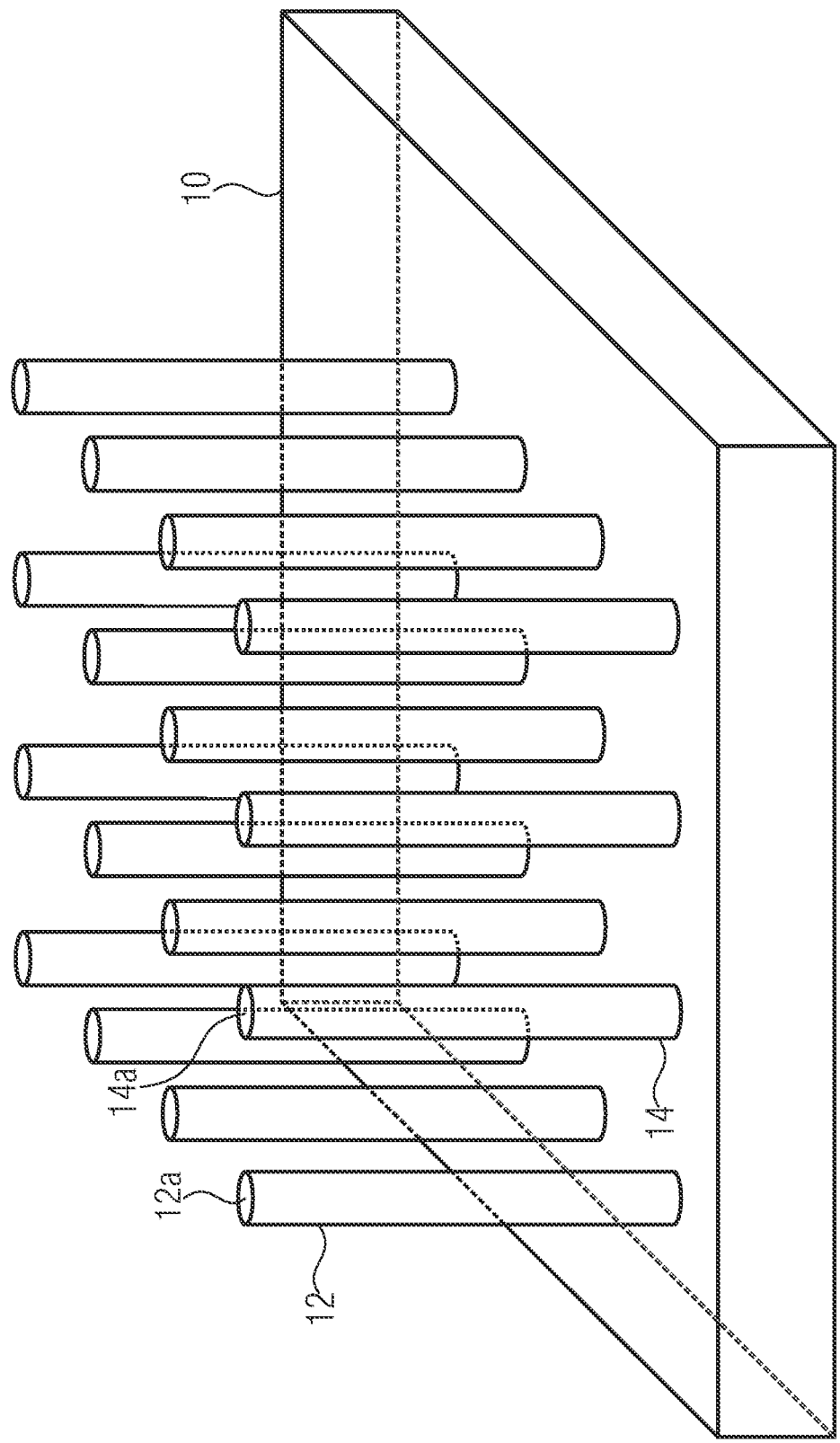

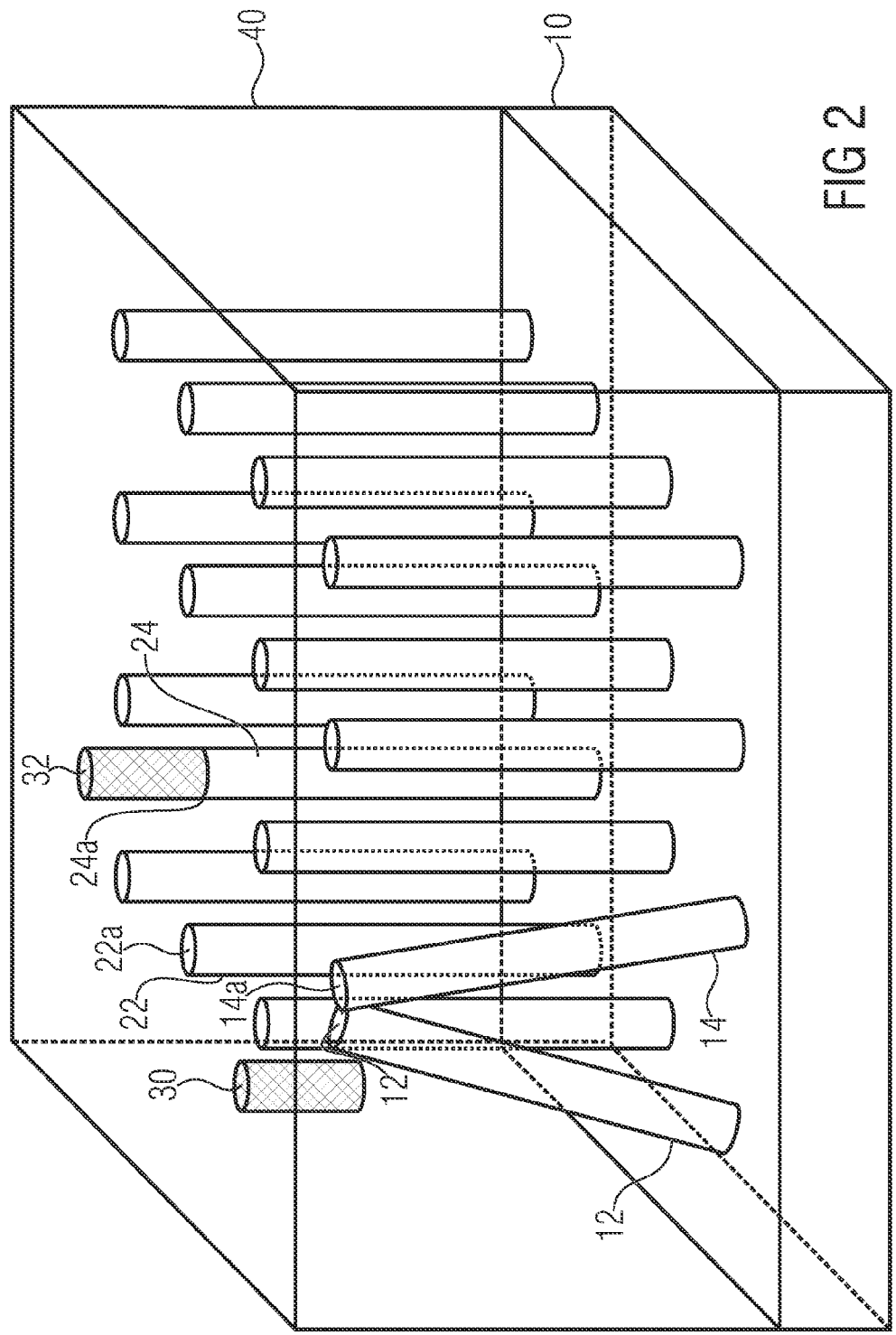

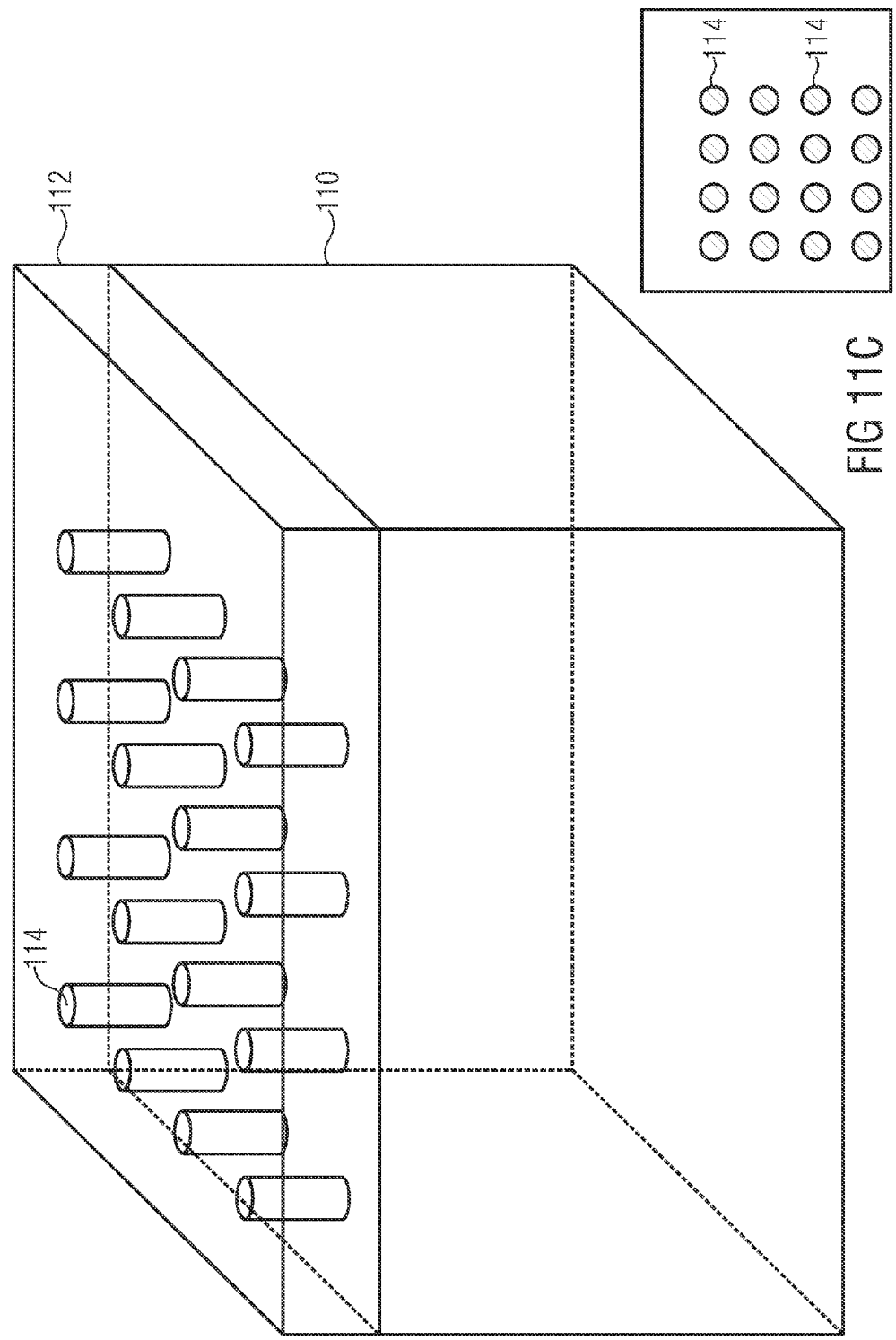

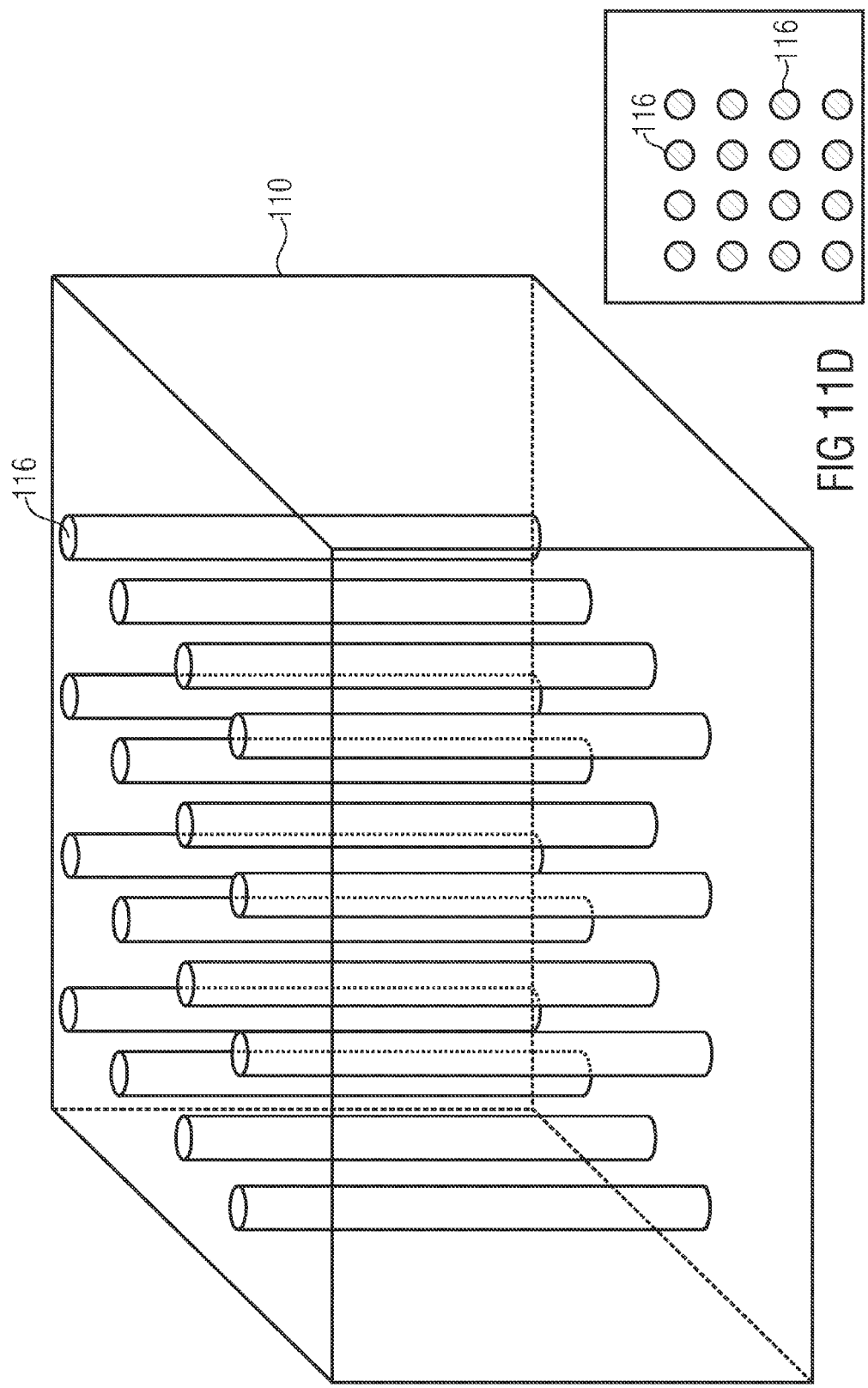

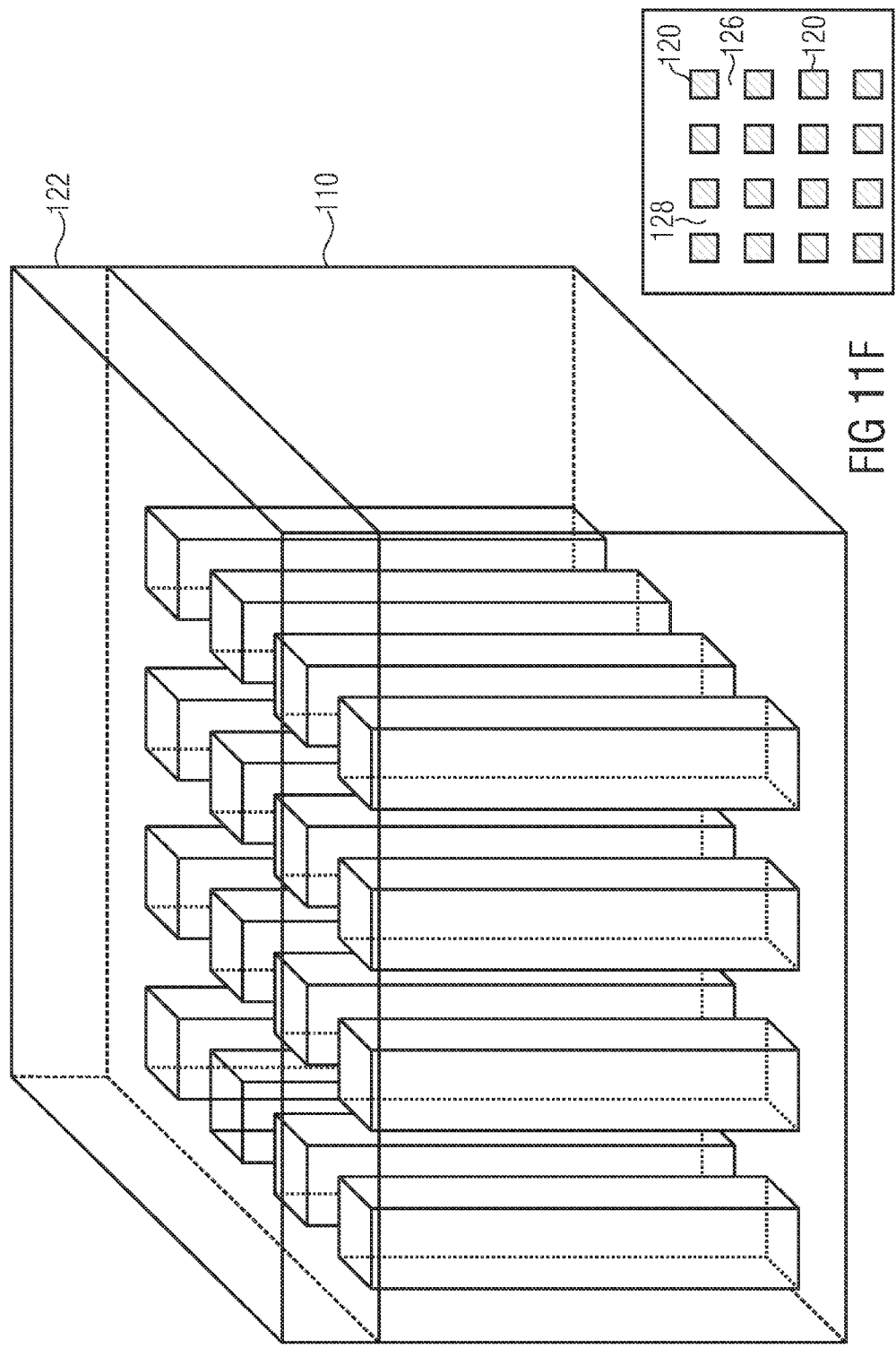

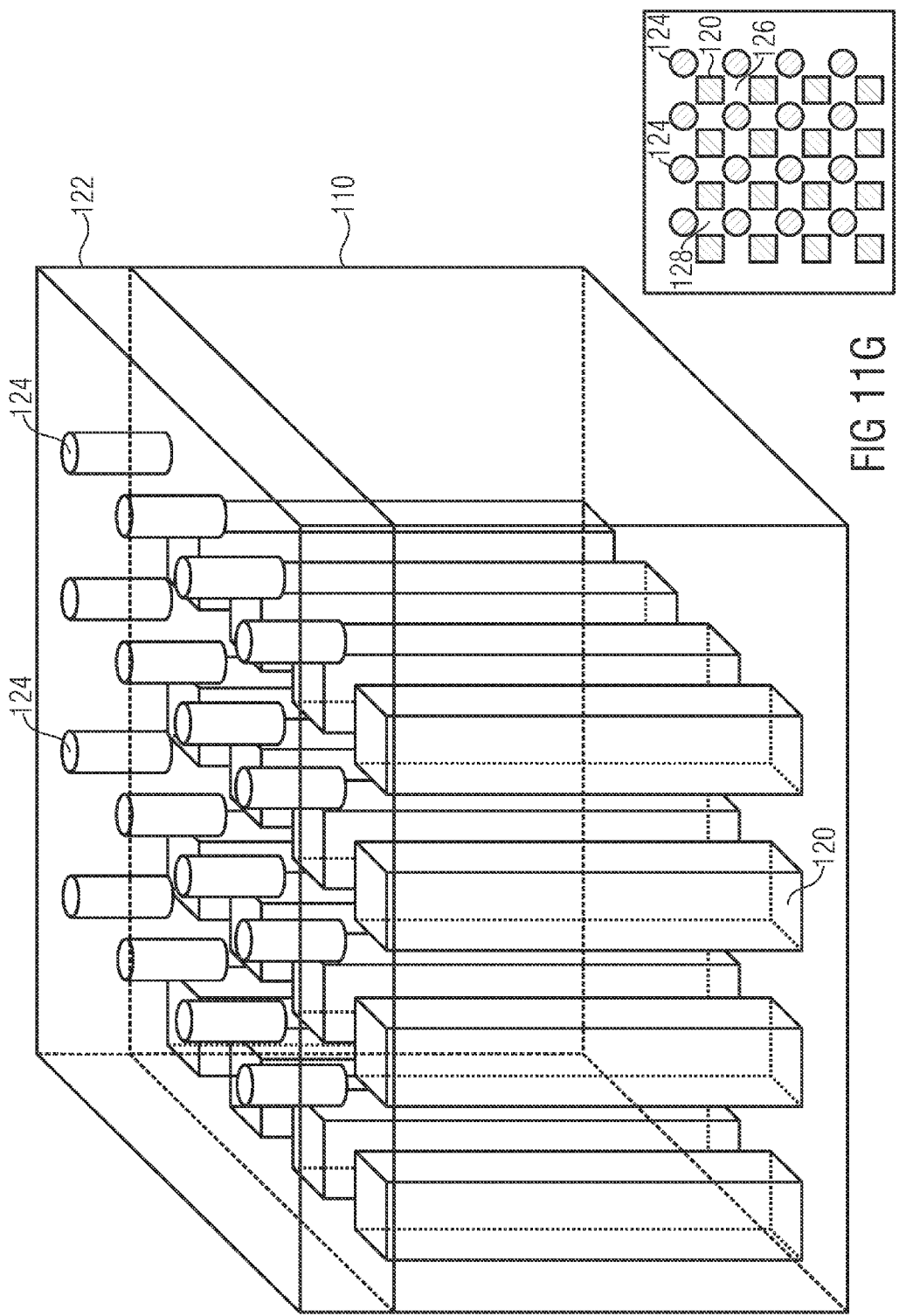

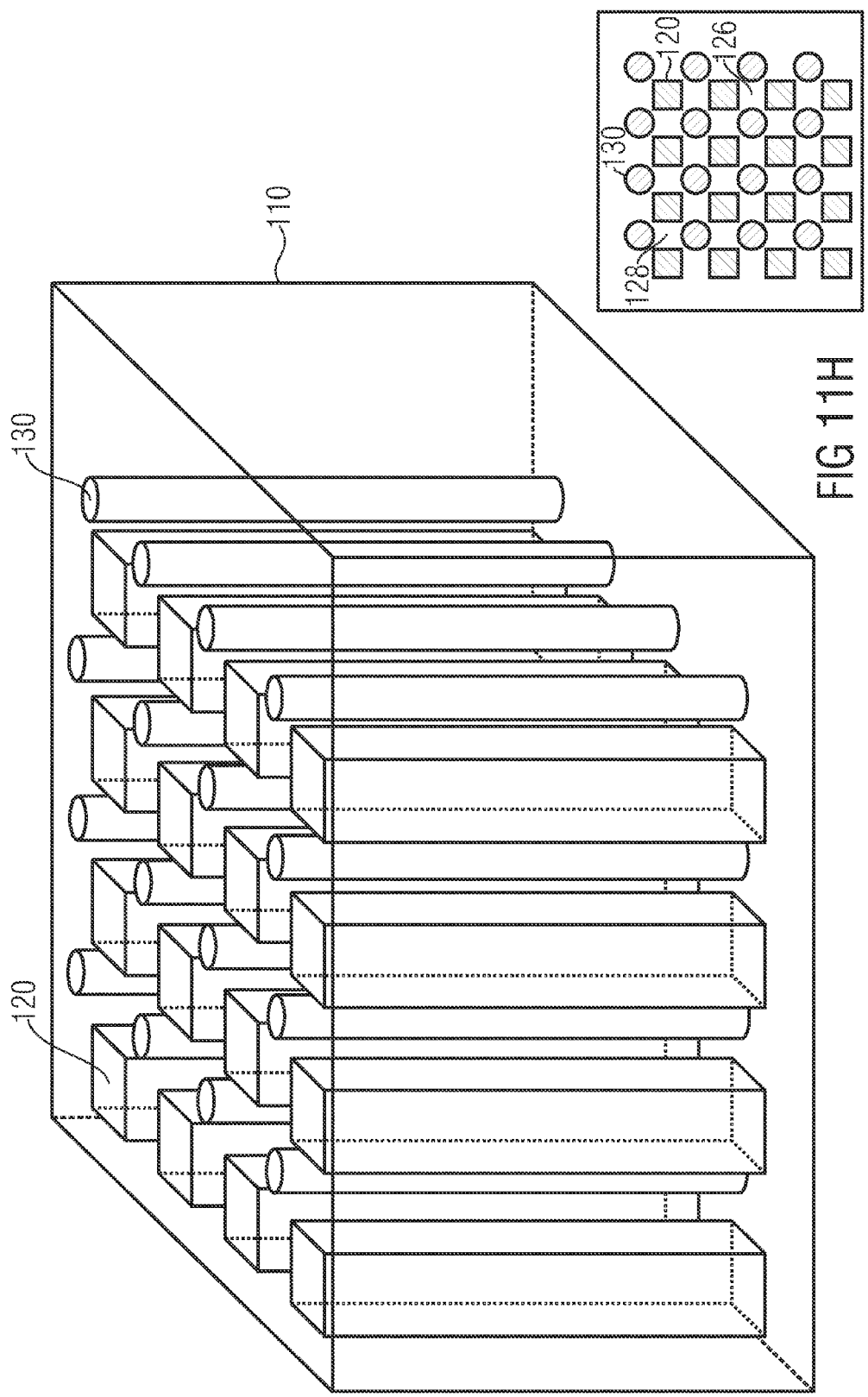

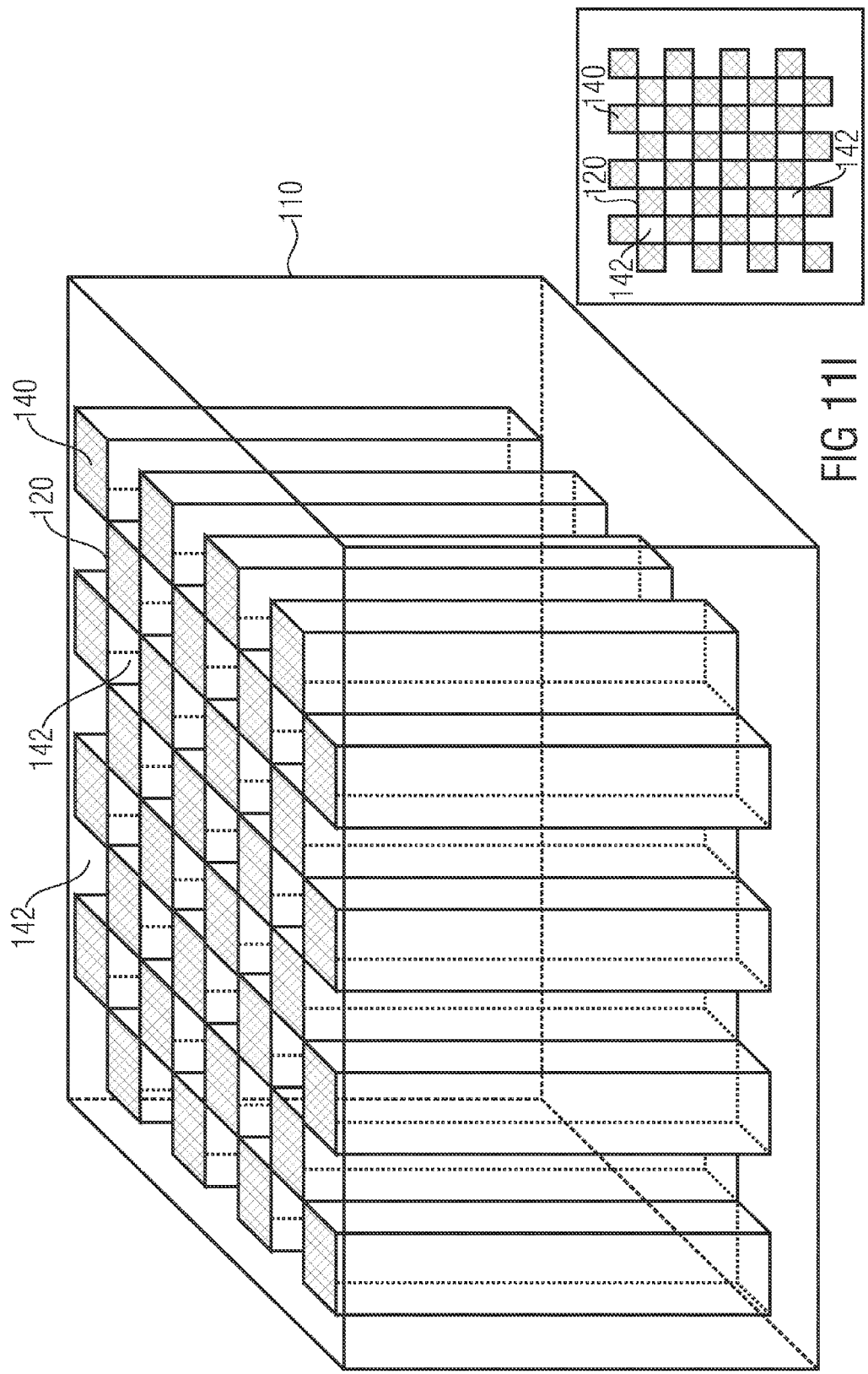

APPARATUS, STORAGE DEVICE, SWITCH AND METHODS, WHICH INCLUDE MICROSTRUCTURES EXTENDING FROM A SUPPORT

TECHNICAL FIELD

Embodiments relate to the field of apparatuses, such as permanent storage devices or switches, which comprise mechanical structures that may define different states. Embodiments provide for methods of adjusting such an apparatus to define a first state and a second state, and embodiments relate to a method for manufacturing an apparatus comprising mechanical structures.

BACKGROUND

Manufacturing micromechanical switches, storage device elements or electrically conductive bridge structures is a recurrent challenge in the information and semiconductor technology. Switches should be programmable in an individual manner and the required space on a chip should be low. Permanent storage devices store an increasing amount of data at an area as small as possible. Thus, miniaturization of storage devices is an everlasting demand. Moreover, the storage devices should provide a permanent storage, wherein data losses such as by aging, radiation, electrical fields or temperature influences shall be avoided.

SUMMARY OF THE INVENTION

Embodiments provide for an apparatus comprising a support and a plurality of bendable and conductive microstructures extending from the support. Two adjacent microstructures of the plurality of microstructures define a detectable first state if they are not bent such that end portions thereof, which are distal with respect to the support, do not touch each other. The two adjacent microstructures of the plurality of microstructures define a detectable second state if they are bent such that end portions thereof, which are distal with respect to the support, touch each other and are fixed to each other.

BRIEF DESCRIPTION OF THE DRAWINGS

In the following, embodiments of the present invention are explained in more detail with reference to the accompanying drawings, in which:

FIGS. 1a and 1b show schematic views of an apparatus defining two different states;

FIG. 2 shows a schematic view of an embodiment of a permanent storage device;

FIGS. 11a to 11j show schematic views showing an embodiment of a method for manufacturing an apparatus comprising an array of microstructures extending from a support.

DETAILED DESCRIPTION OF ILLUSTRATIVE EMBODIMENTS

Figure 1B:
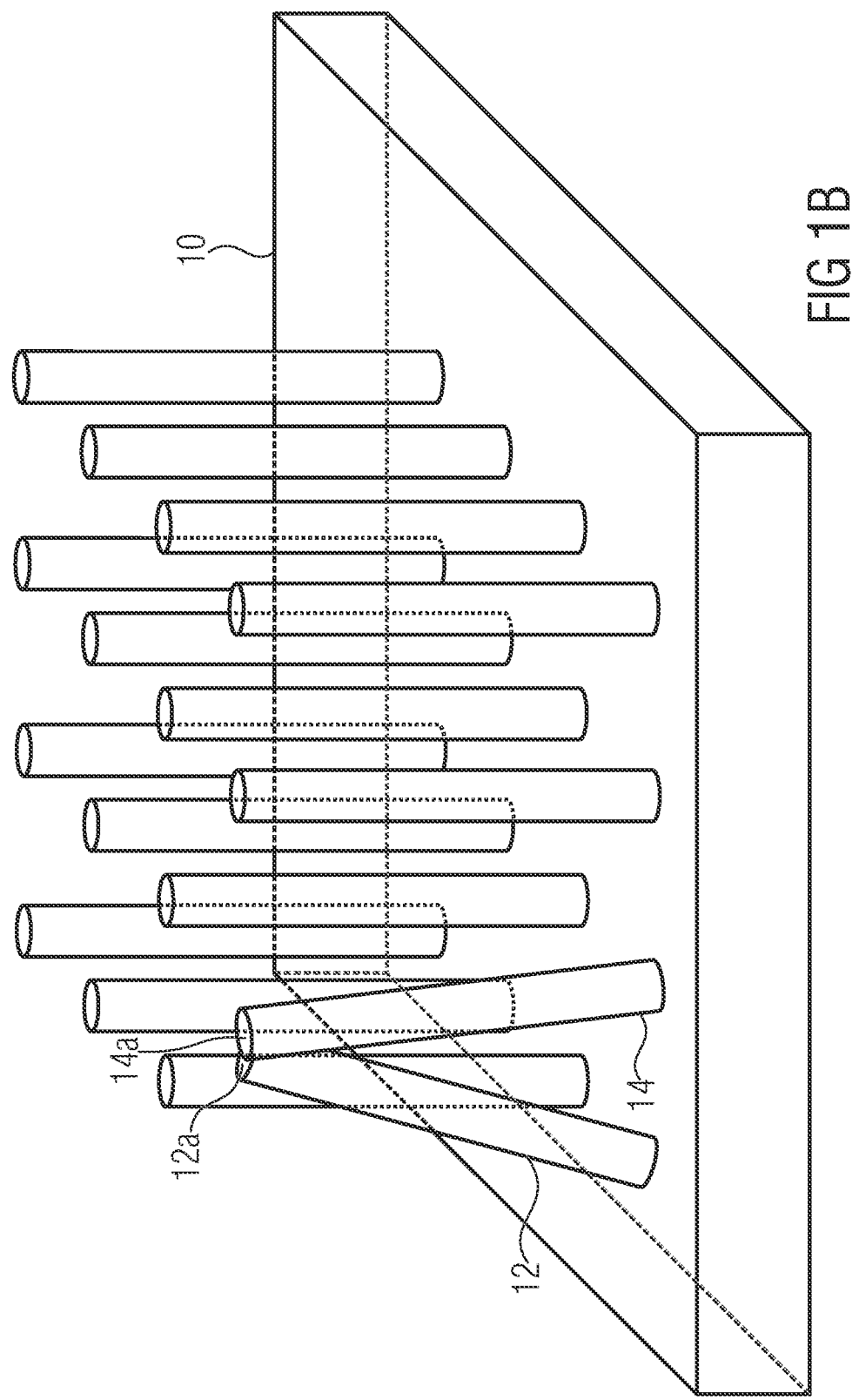

FIG. 1 shows an embodiment of an apparatus comprising a support 10 and a plurality of bendable and conductive microstructures extending from the support 10, such as microstructures 12 and 14 in FIG. 1a. In the array of microstructures shown in FIG. 1a, microstructures 12 and 14 represent two adjacent microstructures of the plurality of microstructures, which are not bent such that end portions 12a and 12b thereof, which are distal with respect to the support 10, do not touch each other. Thus, in the terminology used in the present application, adjacent microstructures 12 and 14 define a detectable second state. According to FIG. 1b, the adjacent microstructures 12 and 14 are bent such that the end portions 12a and 14a touch each other and are fixed to each other. Thus, in FIG. 1b, microstructures 12 and 14 define a detectable first state.

The term microstructure as used herein is meant to cover any mechanical structure having dimensions in the range of nanometers or micrometers, i.e., below 1 millimeter. In particular, the term microstructure is meant to cover structures having such dimensions, that same have such a flexibility that the portions thereof which are distal with respect to the support, upon having been brought in contact with each other, remain fixed to each other by van der Waals forces. The microstructures have such dimensions and adjacent microstructures are arranged so that adjacent microstructures are bendable towards each other and the distal portions thereof can touch each other.

In embodiments, the support may be a plate-like support member. In embodiments, the microstructures are elongate in a direction perpendicular to the support, such as perpendicular to a plane defined by the main dimensions (length and width) of a plate-like support member. The height of the microstructures above the support, i.e., the length thereof, may be more than five or ten times the dimensions thereof in directions perpendicular to the length direction. An aspect ratio (length/width) between 15 and 25, such as 20, may be appropriate to provide for flexible structures having sufficient stability.

In embodiments, the microstructures may be formed of any suitable material, for example semiconductor material, such as silicon, TiN, carbon or the like. The microstructures are formed of a material and have such dimensions that same are bendable, i.e., flexible in a direction perpendicular to the elongate extension thereof.

In embodiments, such as that shown in the Figures, the microstructures may be formed by elongate pins which may have a height of more than 500 nm or more than one μm. In embodiments, the maximum extension of the elongate pins in a direction perpendicular to the height thereof may be in the order of 25 to 75 nm. In embodiments, the elongate pins may be cylinder-shaped having a diameter of about 50 nm.

In other embodiments, the microstructures may have any other conceivable cross-sectional form, such as an elongate rectangular cross-sectional form with or without rounded corners or an oval cross-sectional form.

In embodiments, the plurality of bendable and conductive microstructures form a highly symmetrical array of microstructures, such as a regular array of rows and columns of microstructures. Lithography processes with minimal structure sizes (F) may be used due to the highly symmetrical arrangement of microstructures.

In embodiments, the support may be formed of any suitable material, such as any suitable conductive material. In embodiments, the support is formed of the same material as the microstructures. In embodiments, the support and the microstructures are formed integrally (in one piece). In embodiments, the support is formed of silicon.

In embodiments, different states between two microstructures (movable structures) are achieved by permanently mechanically bridging (programming) the two movable structures or permanently not mechanically bridging the two movable structures. If the structures are separated, i.e., do not touch each other, they define a first state, such as a first logical state, such as a logical 0. If the structures are connected, i.e., touch each other and are fixed to each other, they define a second state, such as a second logical state, such as a logical 1.

In order to bring the structures from the first state to the second state, forces may be applied locally to the microstructures. In embodiments, electrostatic forces may be used in order to bend adjacent microstructures towards each other. In embodiments, electron beams, such as electron beams of a raster electron microscope, may be used to differently charge adjacent microstructures in order to bring the adjacent microstructures together. In order to apply charges to the microstructures using raster probes, the electron beam is to be turned on and off in a precisely localized manner. To this end, the raster electron microscope may be programmed accordingly. In embodiments of the invention, an electron beam writer generally used in electron beam lithography may be programmed appropriately and used.

In embodiments, electrostatic forces may be applied to the microstructures in a different manner, such as by addressing the microstructures through conductive structures in the substrate, which permit for individually addressing the microstructures. In addition, any other means for applying forces to the microstructures, which are appropriate to locally bend or deflect adjacent microstructures, may be used, such as mechanically touching the microstructures or the like.

The inventors found experimentally that deflecting the individual conductive structures intentionally by means of the electron beam of a raster electron microscope is an appropriate manner to bring adjacent conductive structures together. The reason for this effect are electrostatic charges on adjacent conductive structures and the electrostatic attraction resulting therefrom. A corresponding effect might also be achieved by certain plasma etching steps. Moreover, drying processes may cause deflection of the structures by a capillary action. Thus, a well-directed bending of adjacent microstructures might also be achieved by a locally confined application of such steps or processes.

Raster probe methods, such as scanning tunneling microscopy or atomic force microscopy, may be used for a targeted deflection of the microstructures.

Upon being brought together, the microstructures are held together by van der Waals forces. The microstructures may have such dimensions that the van der Waals forces are very strong and fix the microstructures together. In order to obtain this effect, the microstructures are elastic or at least flexible and, therefore, movable, and the microstructures have a sufficiently small distance from each other. In embodiments, the distance between adjacent microstructure microstructures may be in the range of 50 to 100 nm. In the order of dimensions concerned, the van der Waals forces may be so strong that the microstructures are permanently fixed to each other.

Accordingly, embodiments provide for a method of adjusting an apparatus comprising a support and a plurality of bendable and conductive microstructures extending from the support to define a first state or a second state, the method comprising not bending two adjacent microstructures of the plurality of microstructures such that end portions thereof, which are distal with respect to the support, do not touch each other to define the first state, and bending two adjacent microstructures of the plurality of microstructures such that the end portions thereof, which are distal with respect to the support, touch each other and are fixed to each other to define the second state.

In embodiments, the apparatus may form a switch comprising a support and two bendable and conductive microstructures extending from the support. Two adjacent microstructures of the plurality of microstructures define a first switching state if they are not bent such that end portions thereof, which are distal with respect to the support, do not touch each other, and wherein the two adjacent microstructures of a plurality of microstructures define a second switching state if they are bent such that the end portions thereof, which are distal with respect to the support, touch each other and are fixed together by van der Waals forces. In embodiments, such a switch may be a one-time switch switchable from the first switching state to the second switching state only one time. In embodiments, the switch may be switchable multiple times by providing means to separate the adjacent microstructures from each other, starting from the second switching state.

Accordingly, embodiments provide for a switch utilizing a targeted deflection of microstructures, such as by electrostatic charges as generated in a raster electron microscope, for example. In alternative embodiments, a targeted deflection may be achieved by raster probe methods or capillary forces. If the microstructures have appropriate dimensions, as explained above, they remain connected to each other since same are bound to each other by van der Waals forces.

In embodiments, a plurality of pairs of adjacent microstructures may be provided and the microstructures of each pair may be brought together by selectively applying appropriate forces to the microstructures of the pair as explained above.

Embodiments of an apparatus according to the invention comprise read contacts configured for detecting the first state or the second state.

FIG. 2 shows an embodiment of an apparatus according to the invention, wherein microstructures 12 and 14 form a bridge, i.e., are bent such that the end portions 12*a* and 14*a* thereof touch each other and are fixed to each other. Thus, microstructures 12 and 14 define the second state. Two adjacent microstructures 22 and 24 do not form a bridge, i.e., same are not bent and, therefore, distal portions 22*a* and 24*a* do not touch other. Microstructures 22 and 24 define the first state. The apparatus shown in FIG. 2 comprises read contacts 30 and 32. Only two read contacts are shown for simplicity in FIG. 2, while generally one read contact might be provided for each microstructure of the plurality of microstructures or at least for each two adjacent microstructures of the plurality of microstructures. According to FIG. 2, the read contacts 30, 32 are arranged axially aligned with the microstructures if the microstructures are not bent, i.e., if the microstructures define a detectable first state, see read contact 32 in FIG. 2. Thus, there is an electrical contact between the read contact 32 and the microstructure 24 if the microstructure 24 is not bent to touch one of the microstructure adjacent thereto. Contrary thereto, read contact 30 is not in electrical contact with microstructure 12, with which it would be aligned if microstructure 12 was not deflected or bent.

The read contacts, such as contacts 30 and 32, may be connected to an appropriate evaluation means configured to check as to whether there is an electrical connection between a corresponding read contact and the associated microstructure. For example, the substrate 10 may be conductive and the state of respective adjacent microstructures can be detected by applying a voltage between a respective read contact and the substrate and measuring the resulting current. In case the read contact is electrically connected to the associated microstructure, there will be a measurable current via the read contact into the substrate. If the adjacent microstructures are bent such that the end portions thereof are fixed to each other, see microstructures 12 and 14, the read contact will not be connected to the associated microstructure and there won't be any current from the read contact into the substrate. Accordingly, the state of the respective adjacent microstructures can be determined from measuring the respective currents. In embodiments, two adjacent microstructures in the first state result in a first current and adjacent microstructures defining a second state result in a second current (such as a zero current), so that the respective state can be determined from a comparison of the currents.

Read contacts, such as micro contacts, as described with respect to FIG. 2, represent one possibility to detect the respective states. Another possibility would be to provide for a substrate which comprises conductive structures by which the microstructures can be addressed individually. Thus, it would be possible to evaluate the state of respective adjacent microstructures by applying a voltage via the conductive structures of the substrate and by determining, as to whether a current flows through the microstructures concerned.

In embodiments, the plurality of microstructures is at least partially embedded in an embedding material in order to fix the plurality of microstructures in their respective states. FIG. 2 shows an embedding material 40, in which the plurality of microstructures 12, 14, 22, 24 are embedded. In addition, the read contacts, such as contacts 30 and 32, are embedded in the embedding material 40 in the embodiment shown in FIG. 2. In alternative embodiments, the microstructures or at least portions thereof are embedded in the embedding material only and the read contacts are arranged in an additional layer applied to the surface of the embedding material. The read contacts can be arranged appropriately relative to the microstructures by any suitable means, such as alignment marks and the like.

Thus, the microstructures in their respective states are mechanically fixed by means of the embedding material. That is, the respective states are permanently programmed and cannot be changed by radiation, electrical fields or high temperatures. Thus, embodiments permit for a permanent and reliable storage device. Accordingly, embodiments are based on the recognition that mechanical bridging by utilizing local forces as well as a prefixing of the bridges by van der Waals forces may be used to implement a permanent storage device. A final mechanical fixing may be achieved by embedding the structure in an embedding material. Mechanical bridging by utilizing local forces may be achieved by electrostatic charging processes, for example.

Embodiments provide for a permanent storage device, in which respective groups of x+1 microstructures of the plurality of microstructures form x-bit cells of a memory device, which are capable of storing x-bits, wherein x is a natural number and wherein an x-value stored in a corresponding bit cell depends on which of adjacent microstructures of the respective group are in the first state and which of the adjacent microstructures of the respective group are in the second state. Such embodiments are based on the recognition that different cell concepts and concepts concerning their composition can be developed by utilizing symmetrical array arrangements of microstructures. For example, each group may comprise two adjacent microstructures in the array to form a 1-bit cell. Likewise, respective groups may comprise three, four or five adjacent microstructures which are capable of storing two, three or four bits. By means of appropriate logic units corresponding patterns of microstructures may be interpreted as 1-bit cells, 2-bit cells, 3-bit cells or 4-bit cells. Thus, the required space can be reduced substantially.

Figure 3:
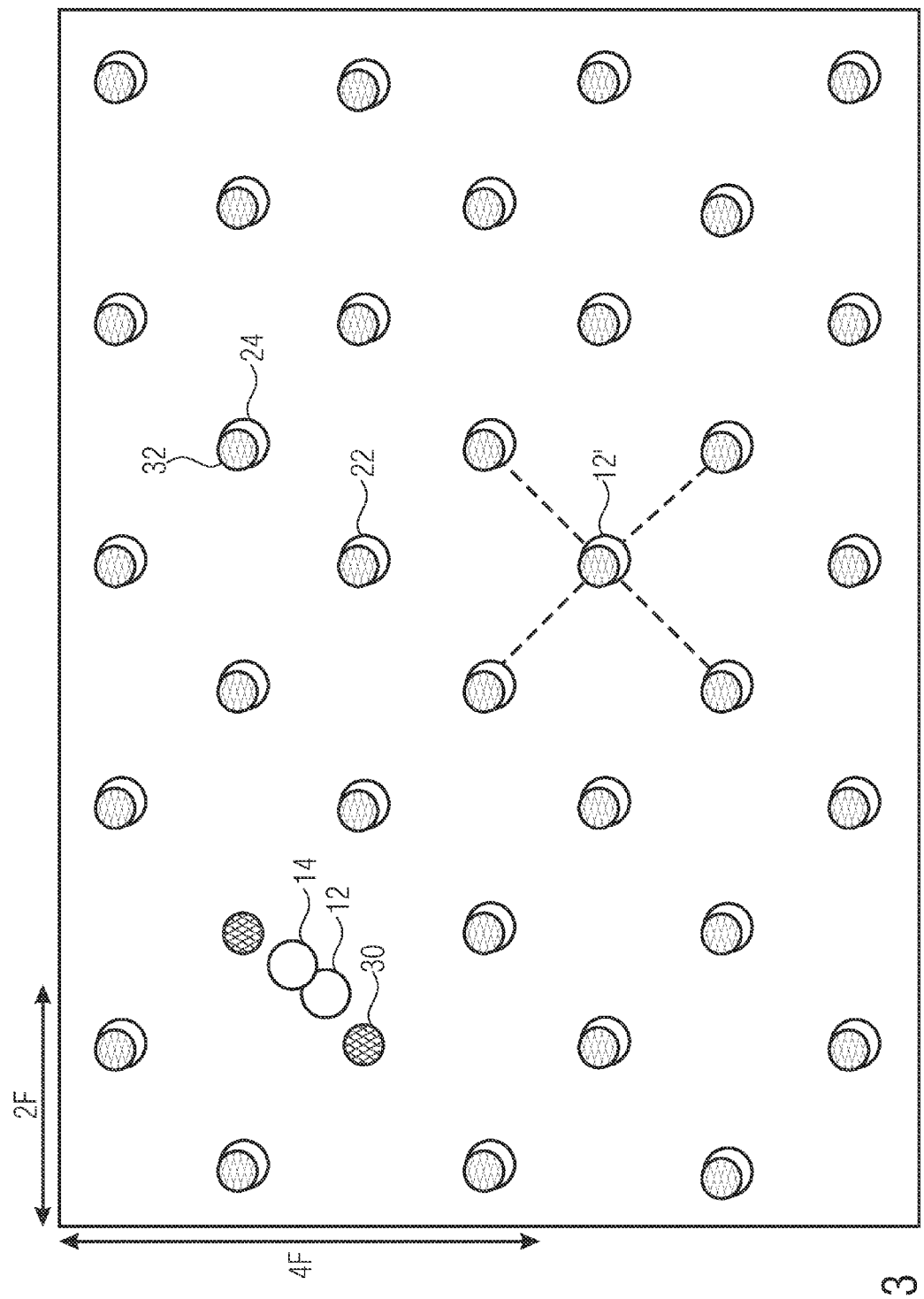
FIG. 3 shows a schematic top view of an embodiment of a permanent storage device.

FIG. 3 is a schematic top view showing an array of microstructures. For illustrative purposes, two microstructures, which are in the bent state, are designated 12 and 14 and two microstructures, which are in the non-bent state, are designated 22 and 24. Moreover, read contacts are shown in FIG. 3, wherein, for illustrative purposes, the read contacts associated with microstructures 12 and 24 are designated 30 and 32. As can be seen from FIG. 3, the contact holes are substantially aligned with the associated microstructure if the microstructures are in a non-bent state. "Substantially aligned" means that the read contact (contact holes) and the associated microstructures at least partially overlap each other so that there is an electrical contact therebetween.

According to embodiments, the plurality of microstructures is arranged in a regular array of rows and columns of microstructures. Accordingly, each microstructure has nearest neighbors, as shown by broken lines for microstructure 12'. In the context of the present invention, two microstructures are adjacent, if same are next to each other within a distance such that the distal ends thereof can be brought into mechanical contact with each other. In embodiments, tow microstructures are adjacent if the distance between them corresponds to the nearest distance between microstructures in a plurality of microstructures, such as a symmetrical array of microstructures. For example, in FIG. 3, microstructure 12 is adjacent to microstructure 14 and microstructure 22 is adjacent to microstructure 24. However, microstructure 12' is not adjacent to microstructure 22 since the distance between them is larger than the nearest distance.

Dimensions 2 F and 4 F are indicated in FIG. 3, wherein F represents the minimal feature size obtainable by a used lithography process and 2 F represents the pitch between two adjacent features in the lithography process.

Figure 4:
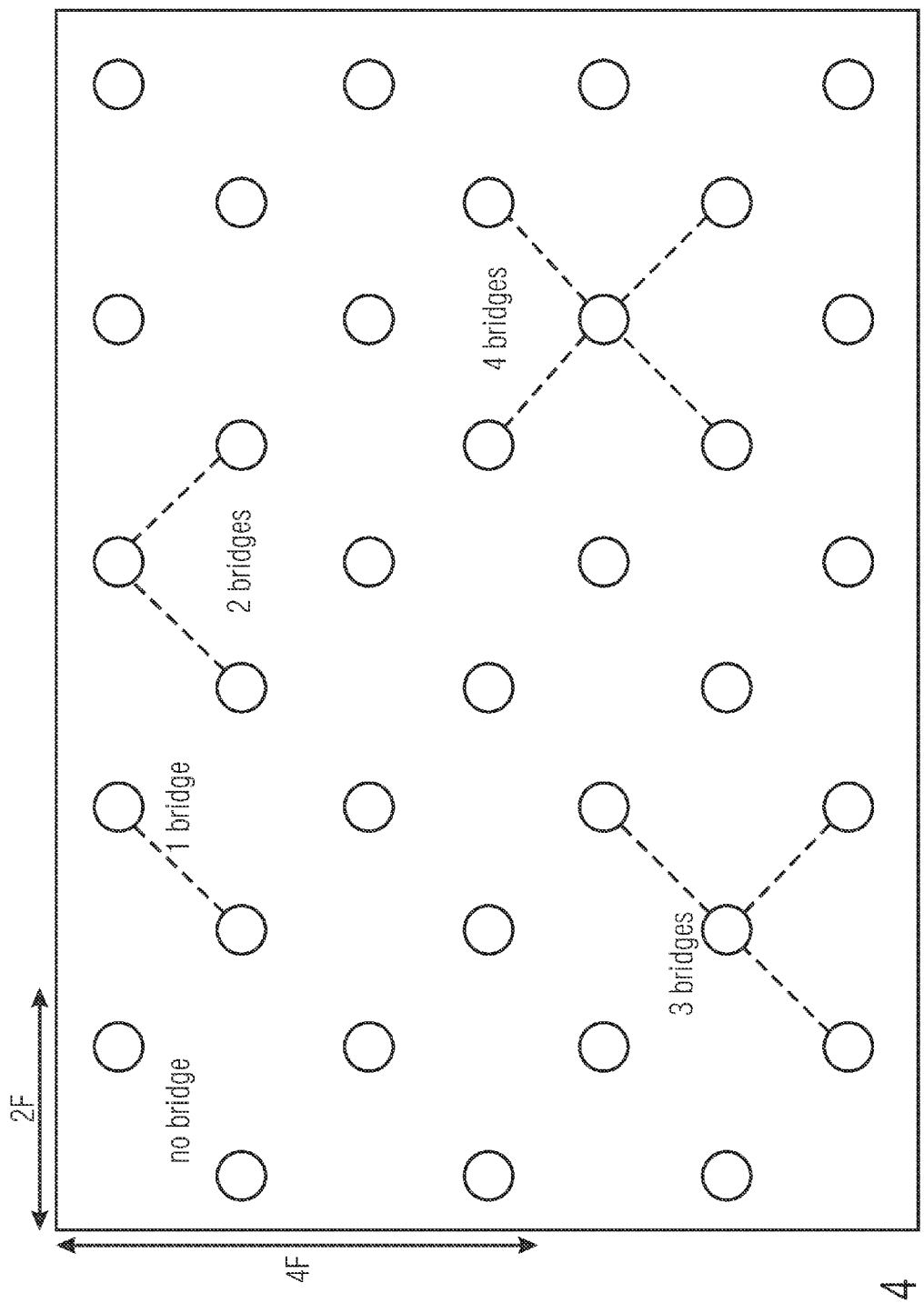
FIGS. 4 to 10 show schematic top views useful in explaining embodiments of permanent storage devices according to embodiments.

FIG. 4 shows a schematic top view of microstructures similar to FIG. 3, but without showing the read contacts. FIG. 4 shows that there are different manners, in which bridges can be formed between adjacent microstructures in the array. As can be seen, one bridge, two bridges, three bridges or four bridges can be effected between neighbors, i.e., adjacent microstructures. In other words, each microstructure can bridge to zero, one, two, three or four nearest neighbors. As explained above, respective bridges can be formed by applying appropriate forces to the microstructures, between which bridges are to be formed.

Figure 5:
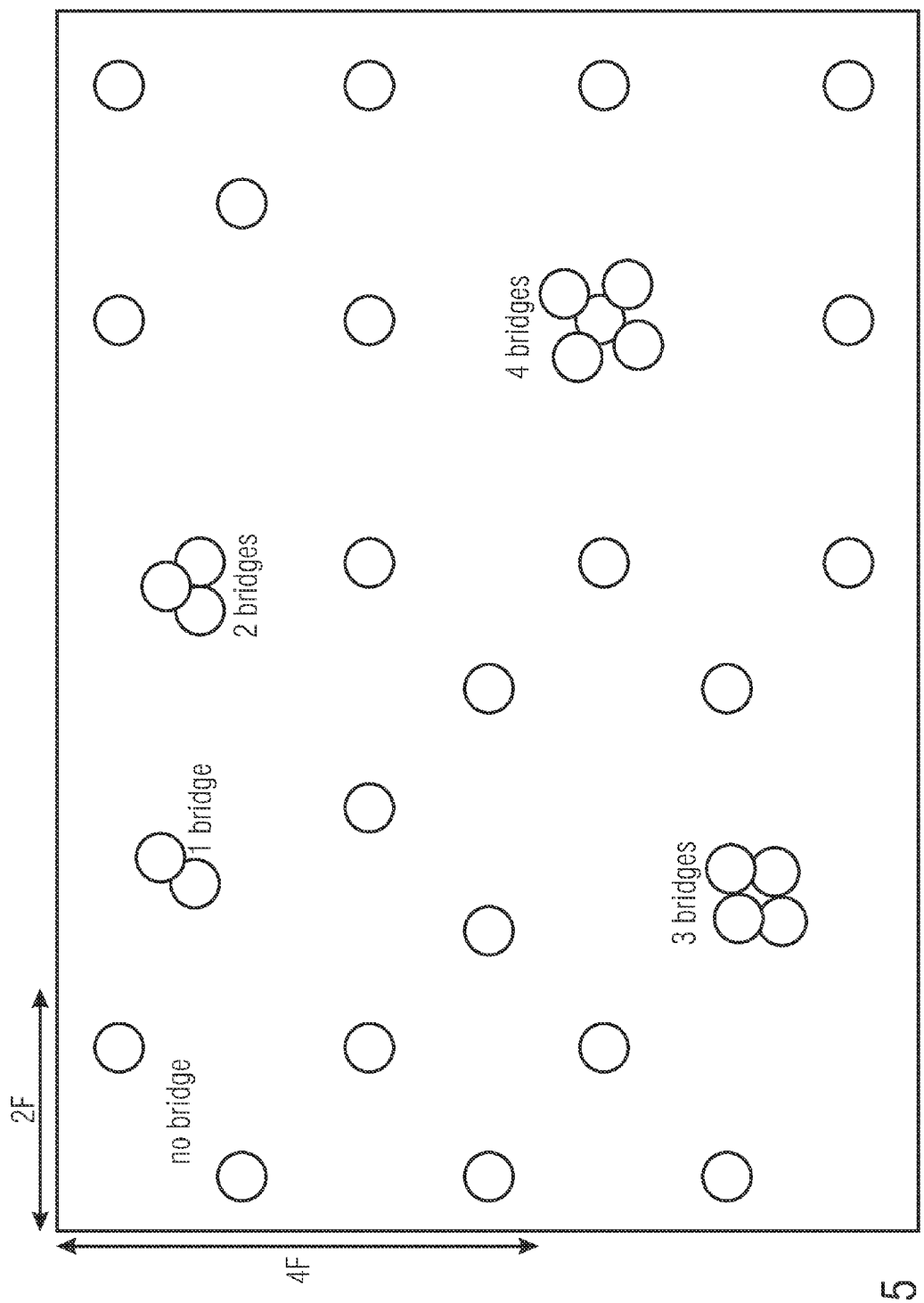

FIG. 5 shows a schematic top view of the resulting structure after bridging. In case of no bridge, the two microstructures are separate from each other. In case of one bridge, two microstructures are fixed to each other, in case of two bridges, three microstructures are fixed to each other, in case of three bridges, four microstructures are fixed to each other and in case of four bridges, five microstructures are fixed to each other. It goes without saying that the respective states obtained thereby can be detected by means of appropriate read contacts as explained above with respect to FIGS. 2 and 3, for example.

Figure 6:
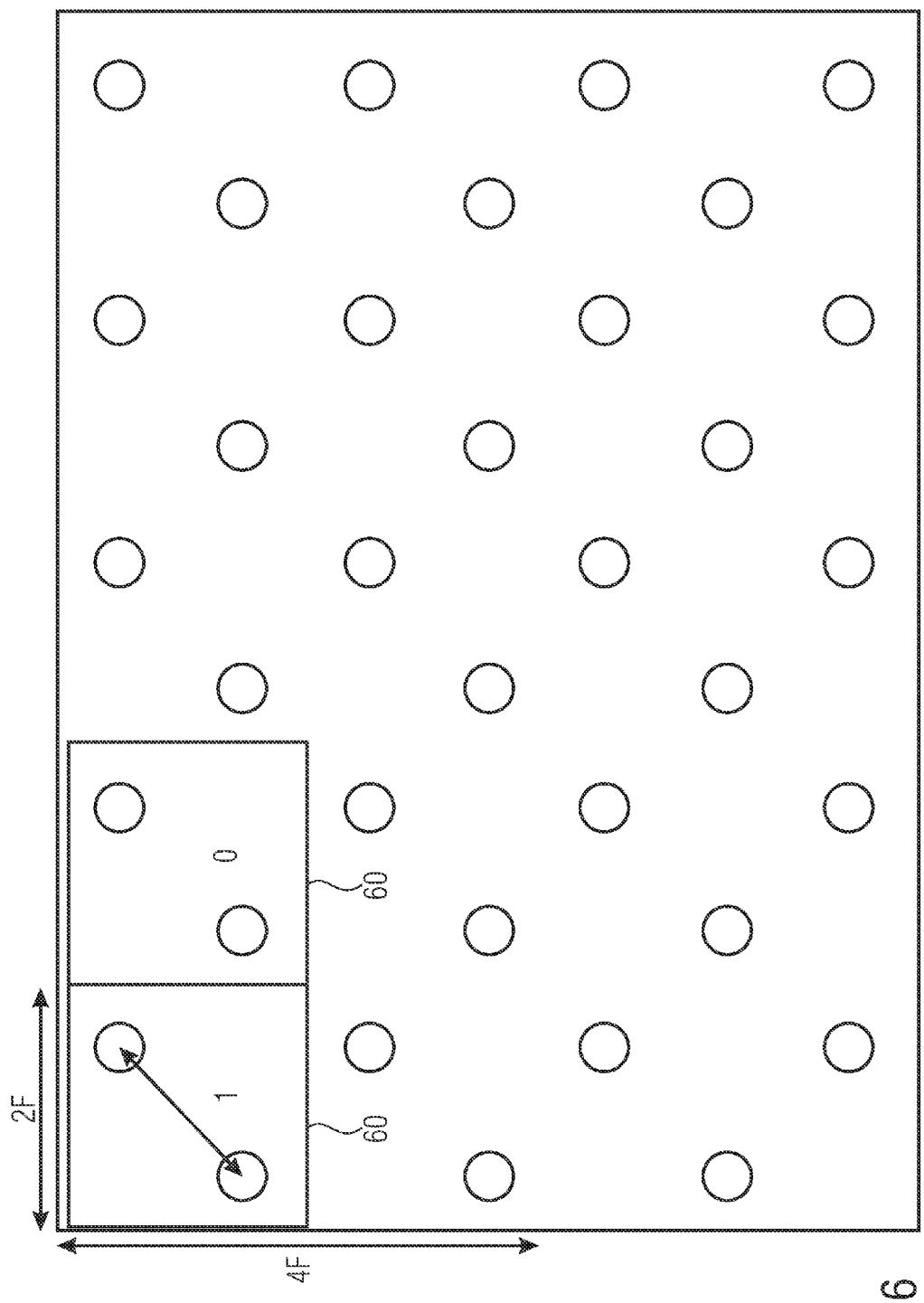

Utilizing the symmetric structure of the two-dimensional array of microstructures, memory cells capable of storing different numbers of bits can be configured. 1-bit cells 60, each of which comprises two adjacent microstructures, are shown in FIG. 6. The memory cells 60 and 62 can assume a different bit value dependent on whether the microstructures are bent to be fixed to each other or not. According to FIG. 6, each bit cell occupies an area of $4 F^2$. Thus, an area of $4 F^2$ is required per bit, wherein 100% of the area is used.

Figure 7:
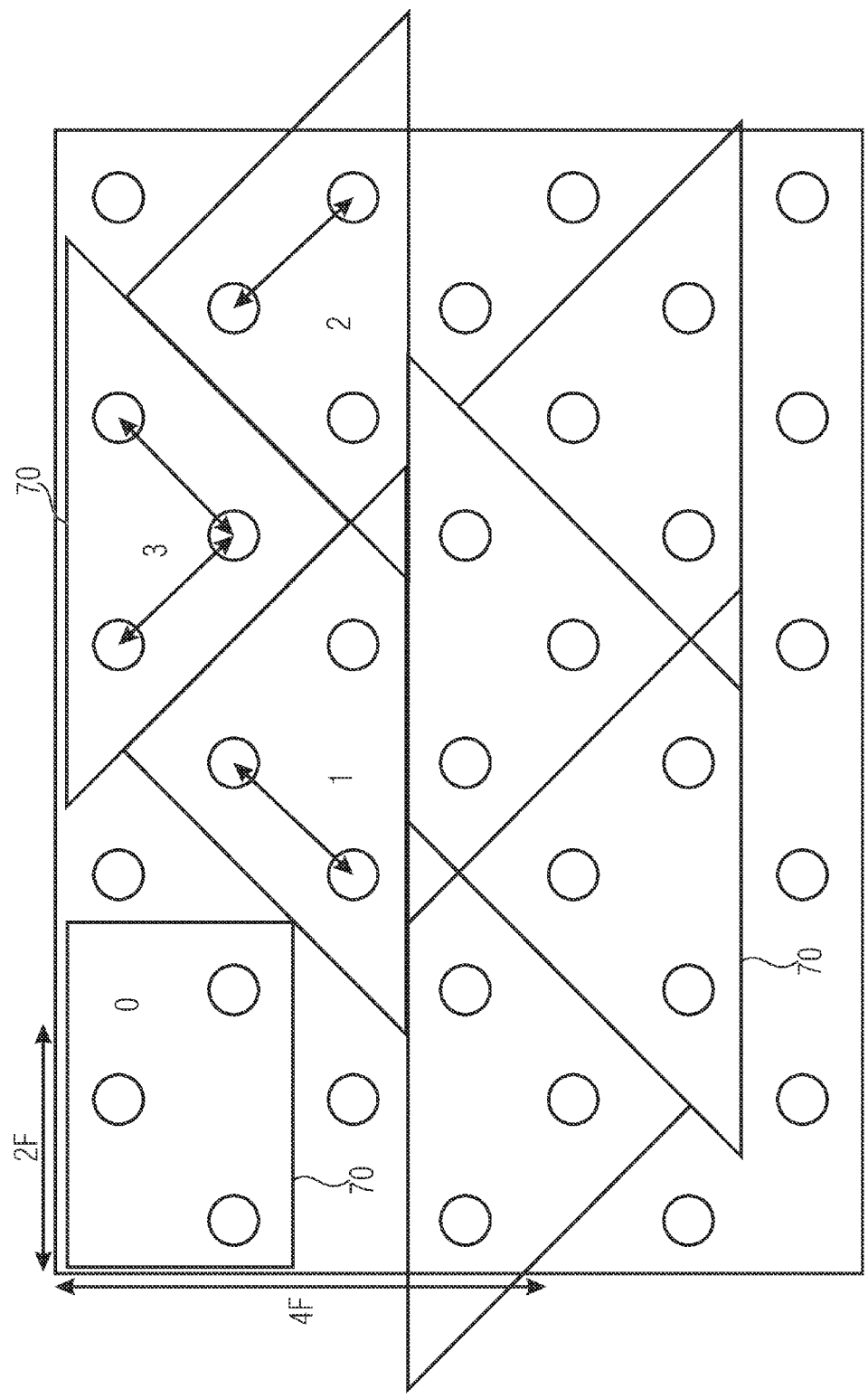

FIG. 7 shows 2-bit cells 70. Each two-bit cell comprises three microstructures, from which respective two are adjacent to each other. The microstructures of a cell or group are arranged on the vertices of a triangle formed when connecting the centers of the respective microstructures. Four possible states of the 2-bit cells shown in FIG. 7 can be achieved dependent on which of the microstructures contributing to a group are bridged and which are not. Respective possible bridges are shown by bidirectional arrows in FIGS. 7-10.

Figure 8:
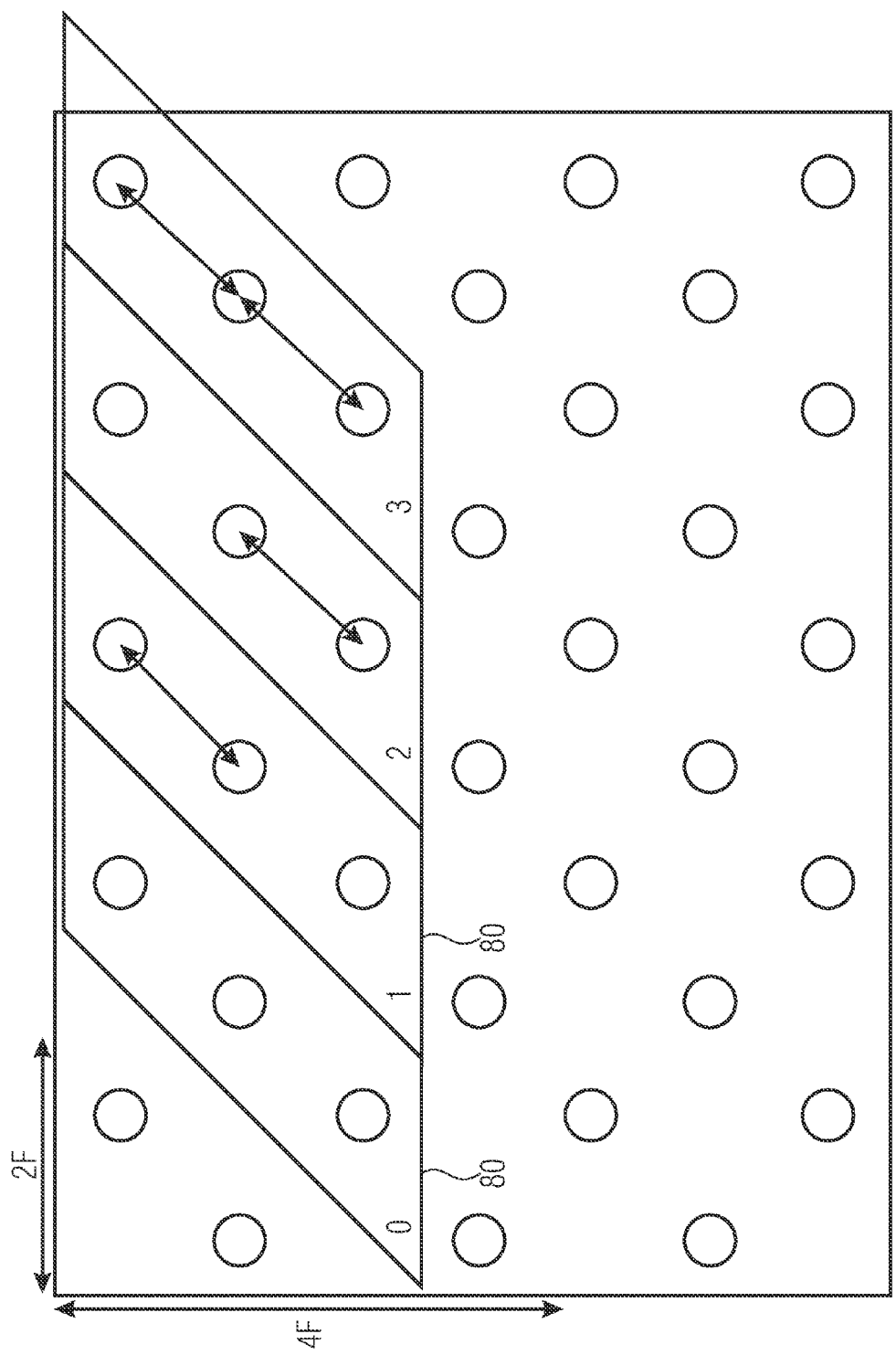

FIG. 8 shows an alternative embodiment of 2-bit cells 80, in which the microstructures of a cell or group are arranged in a row. Again, four states are possible depending on which microstructures are bridged and which are not.

In the 2-bit cells shown in FIGS. 7 and 8, the area required by each cell is 6 $F^2$ resulting in an area of 3 $F^2$ per bit. 100% of the area may be used.

Figure 9:
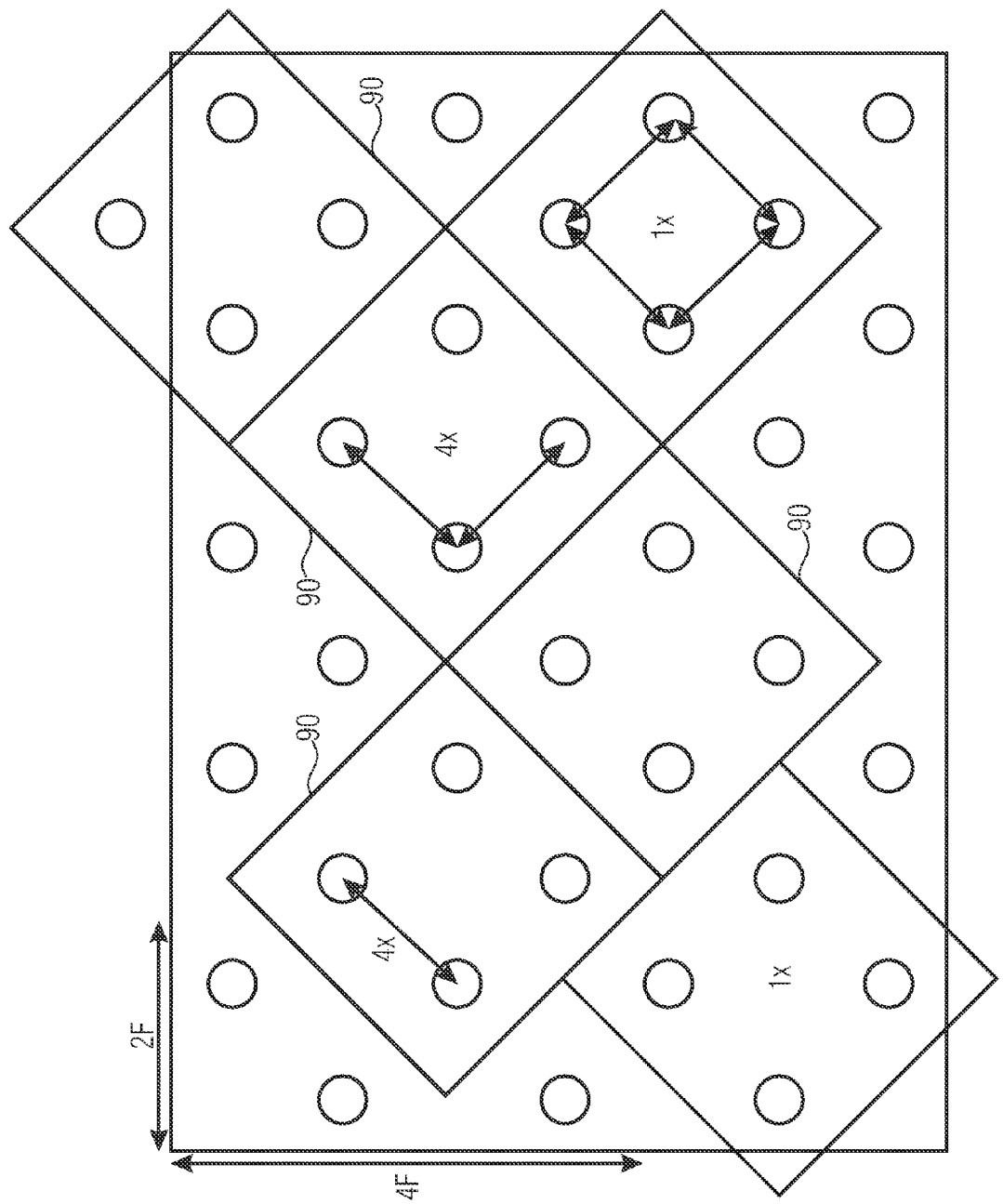

FIG. 9 shows 3-bit cells 90, each of which comprises four microstructures. Each microstructure of each cell has two adjacent microstructures. As indicated by the arrows in FIG. 9, there are at least eight different possibilities to bridge the microstructures of a cell 90 and, therefore, each memory cell 90 may represent three bits. As can be seen in FIG. 9, the microstructures of each cell are arranged on the vertices of a square formed when connecting the centers of the respective microstructures. As can be derived from FIG. 9, the required area per bit cell in the 3-bit cell of FIG. 9 is 8 $F^2$, resulting in a required area of 2.66 $F^2$ per bit. 100% of the area can be used.

Figure 10:
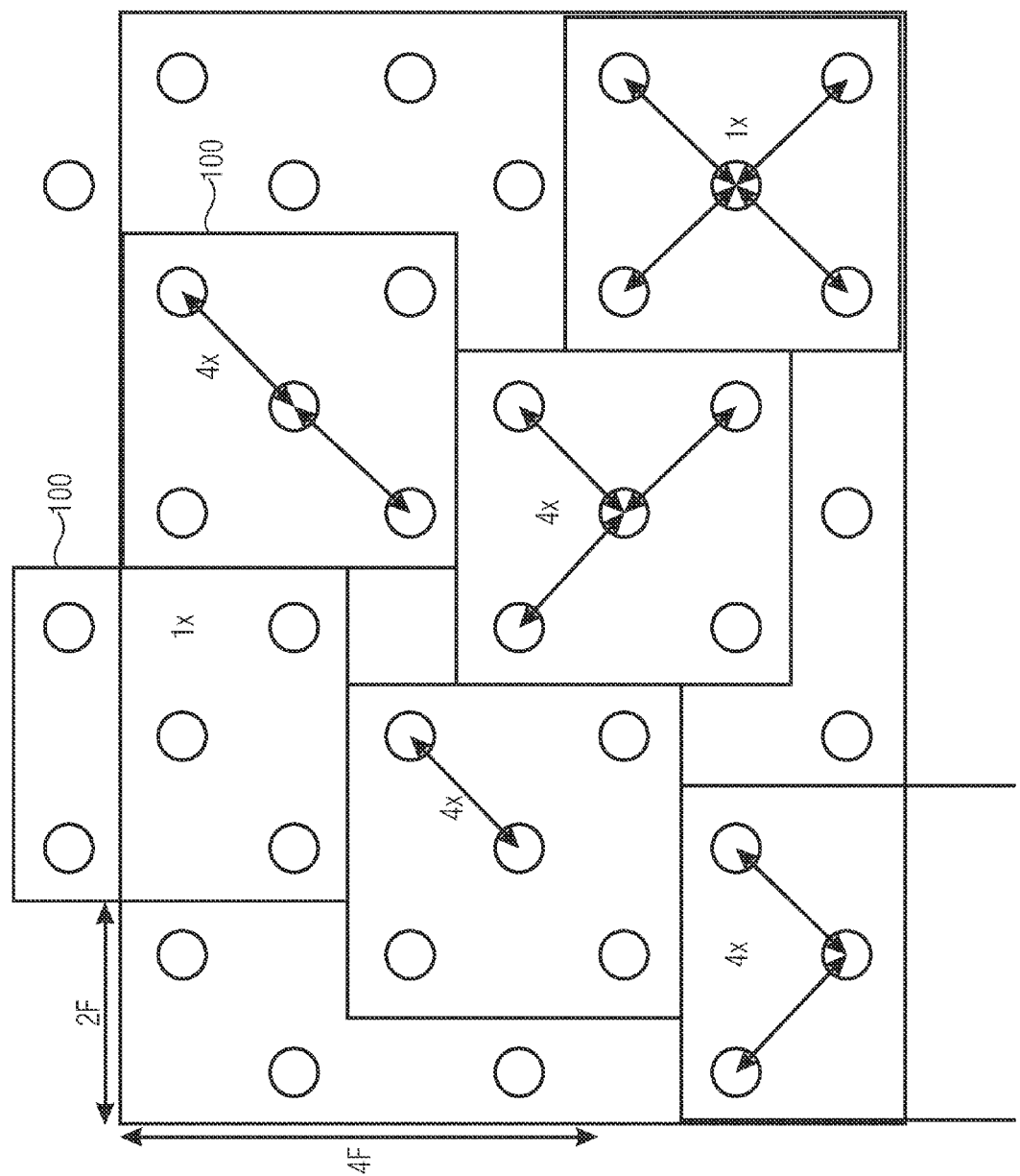

FIG. 10 shows an arrangement in which 4-bit cells 100 are formed. Each 4-bit cell comprises five microstructures and the microstructures of each cell are arranged on the corners of a square formed by connecting the centers of four of the microstructures and a further microstructure is located in the center of the square. As can be seen from the arrows in FIG. 10, such an arrangement provides for at least 16 different bridging possibilities and, therefore, four bits can be represented by each cell of the arrangement shown in FIG. 10. The required area per bit cell is 10 $F^2$, resulting in a required area per bit of 2.5 $F^2$. 90% of the area may be used.

The feature size F depends on the used lithography. Recent technologies may have a feature size of 90 nm, 60 nm or even less, such as 30 nm. Embodiments permit a permanent storage device with a low required area and a reliable permanent storage. Embodiments permit symmetrical arrays of conductive microstructures, which may be implemented in the minimum required space possible. As explained above, the cell size for a 1-bit cell may be as small as 4 $F^2$, for a 2-bit cell may be as small as 6 $F^2$, for a 3-bit cell may be as small as 8 $F^2$, and for a 4-bit cell may be as small as 10 $F^2$. Thus, a required space of 2.5 $F^2$ per bit is possible.

A permanent storage device according to embodiments can be programmed by effecting bridges between the respective microstructures of a memory cell indicative of a desired x-bit value. Thus, desired x-bit values can be stored in each of the memory cells. Generally, adjacent microstructures within different x-bit cells may be bent differently in order to store different x-bit values in the different x-bit cells. As far as the possibilities of differently bending adjacent microstructures within the different x-bit cells are concerned, reference is made to FIGS. 6 to 10 and the explanation thereof. In the embodiments, two adjacent microstructures of a cell can be bridged by applying charges to the microstructures in order to bend them toward each other. Upon bending them towards each other, the distal ends are fixed to each other by van der Waals forces.

In embodiments, applying charges to the microstructures may comprise applying charges using methods of scanning probe microscopy. Thereupon, the plurality of microstructures may be mechanically fixed in their respective states by at least partially embedding the microstructures in an embedding material to permanently and reliably store the associated bit values.

Embodiments provide for a method for manufacturing an apparatus comprising an array of microstructures extending from a support, the method comprising: forming a plurality of first holes in a substrate, wherein the first holes are arranged in rows and columns of a regular array, wherein ridges remain between adjacent rows and columns of the regular array; forming a plurality of second holes in crossing points of the ridges, such that the second holes are arranged in rows and columns of a regular array, wherein the first and second holes abut to each other or overlap such that the microstructures are formed between adjacent ones of the first holes and adjacent ones of the second holes.

Embodiments provide for a corresponding method for generating a highly symmetrical array of conductive microstructures, which allows the usage of lithography processes with minimum structure sizes F. In embodiments, the method may be used for manufacturing a corresponding apparatus for a permanent storage device, wherein the cell size per bit may be substantially reduced, such as reduced by a factor of 2, wherein the resulting cell size may be as small as 2.5 $F^2$ per bit.

After manufacturing such an apparatus comprising an array of conductive microstructures, respective groups of microstructures can be associated to memory cells and programmed, as explained above with respect to FIGS. 6 to 10. As explained, appropriate read contacts may be provided to read the states of the respective microstructures and an appropriate evaluator may be provided in order to derive the associated bit values from the read out states.

Accordingly, embodiments provide for a simple method for manufacturing an array of microstructures, in particular conductive microstructures. Embodiments of the inventive method permit for a generation of structure sizes less than F and resulting pitches of less than 2 F. Thus, two microstructures may be formed on an area 4 $F^2$. This permits the implementation of permanent storage devices having the lowest required area per bit conceivable.

Figure 11A:
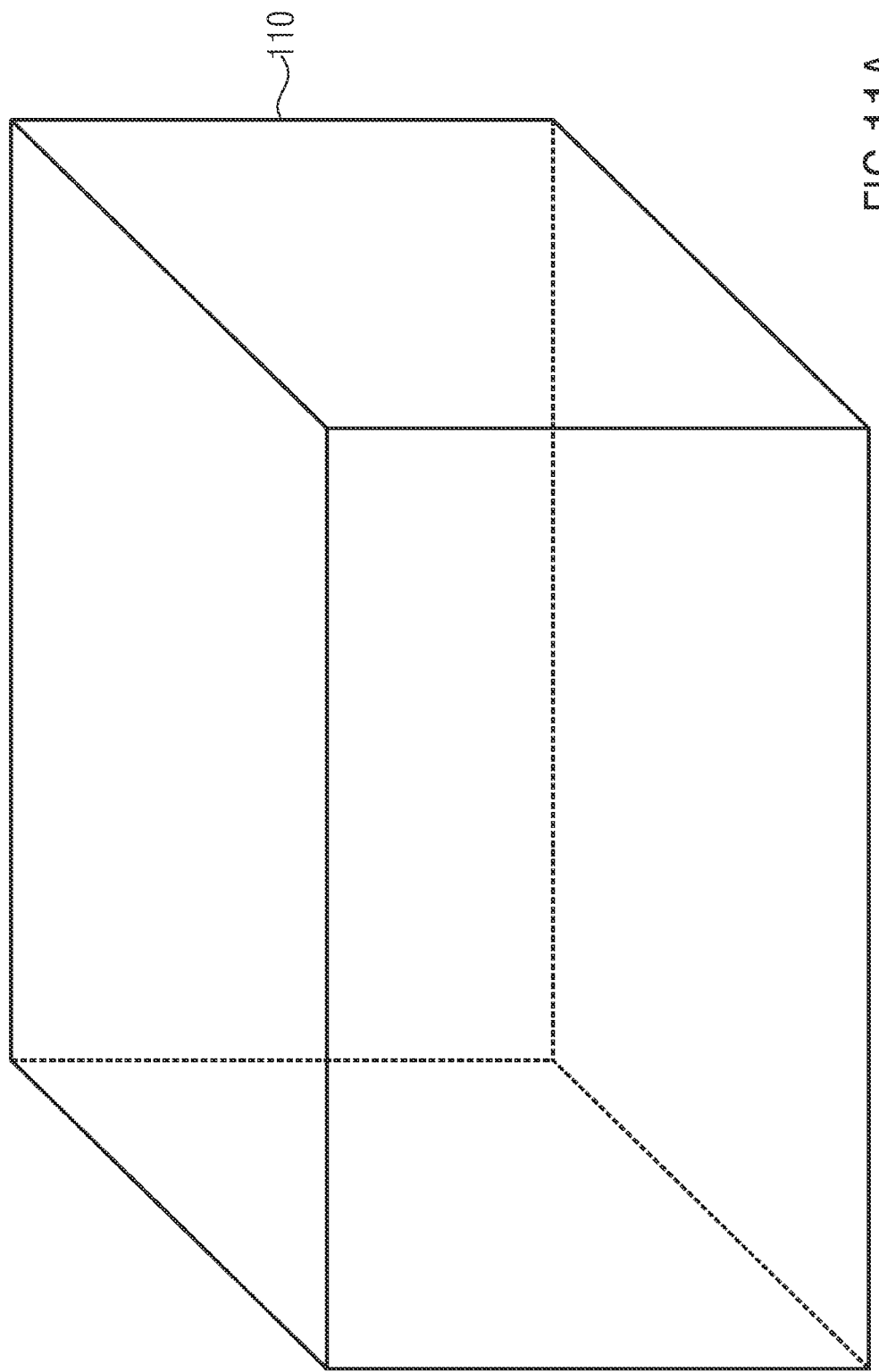

FIG. 11a shows a substrate 110 as a starting point of an embodiment of a method according to the invention. Substrate 110 may be formed from silicon and may have a thickness from a top surface to a bottom surface thereof of 1 to 2 µm. Of course, a substrate having a substantially larger thickness, such as typically several 100 µm, may be used, wherein only an upper portion is used for producing the microstructures, such as an upper portion of a thickness of 1 to 2 µm.

Figure 11B:
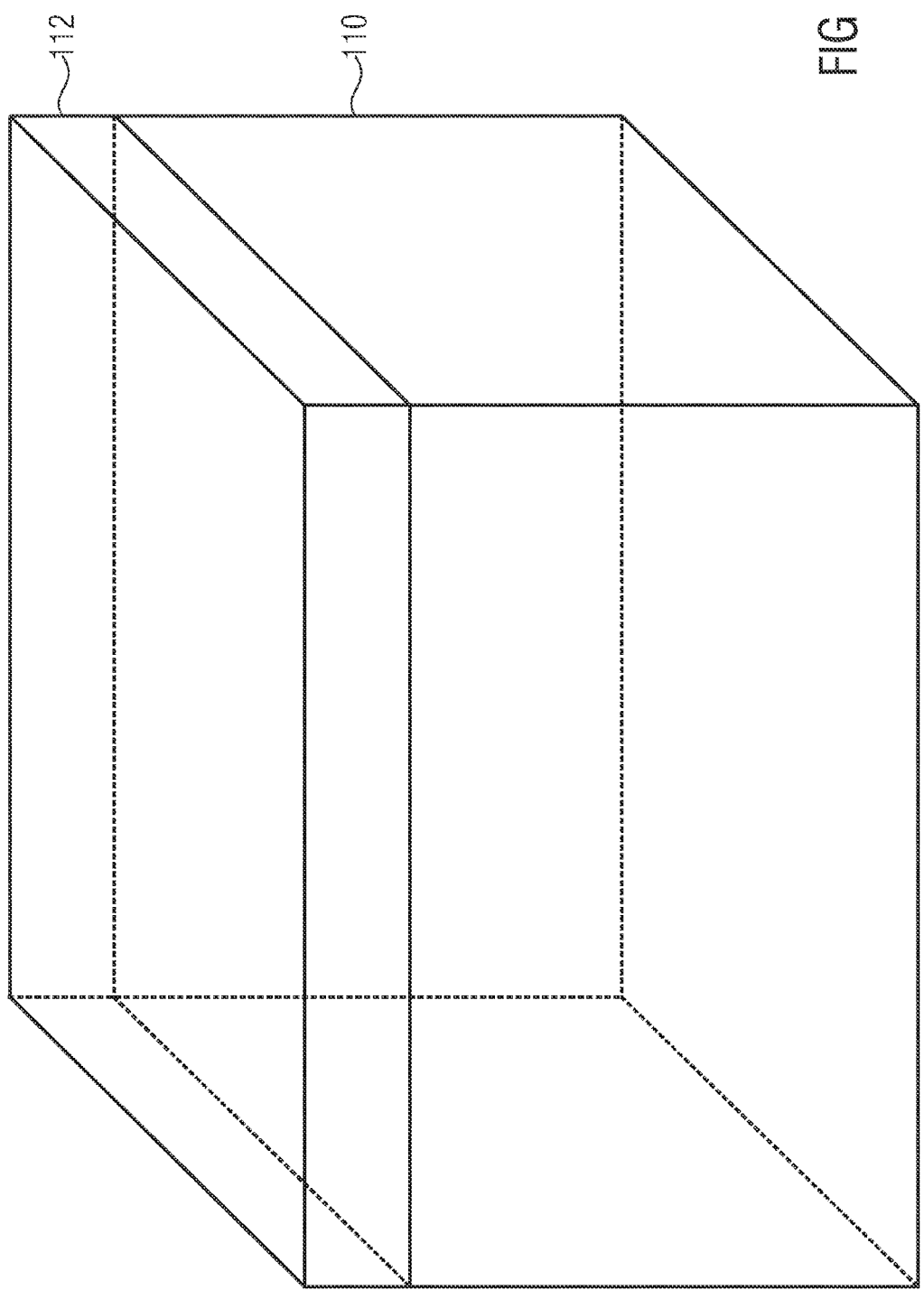

A hard mask 112 is formed on the top surface of substrate 110 as shown in FIG. 11b. Hard mask 112 may be formed of any appropriate material, such as silicon oxide, for example. A first lithography process is performed in order to form first etching openings 114 within the first hard mask 112. A schematic top view showing the first etching openings 114 is shown in the lower right corner of FIG. 11c.

Thereupon, a first etching process is performed through the first etching openings 114 in order to form first voids 116 in substrate 110. The first etching process may be a deep trench etching. First voids 116 are formed to a specific depth such that a portion of the substrate remains below the first voids 116. The portion of the substrate remaining below the first voids 116 serves as support for the microstructures later on. A schematic top view showing the first voids 116 is shown in the lower right portion of FIG. 11d. The first etching process for forming the first voids 116 may be a plasma etching process such as a reactive ion etching (RIE) process. After the first etching process, hard mask 112 is stripped to obtain the structure shown in FIG. 11d.

Figure 11E:
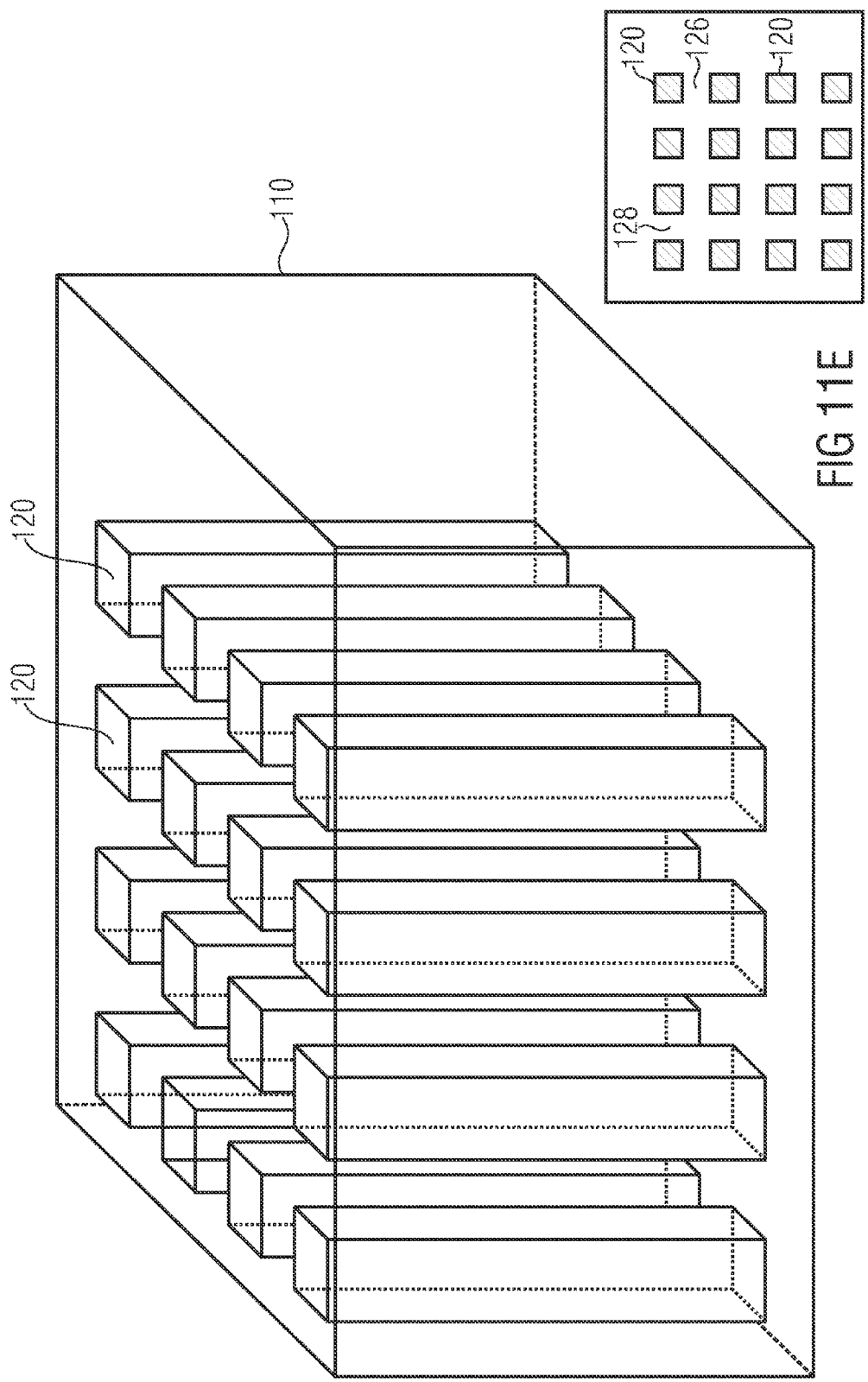

Upon the first etching process, a second etching process is performed to expand the first voids in order to generate first holes 120 in substrate 110. The second etching process may be an anisotropic wet etching process. The resulting structure is shown in FIG. 11e. As shown in the top view (lower right portion) of FIG. 11e, the first holes 120 are arranged in rows and columns of a regular array. Ridges 126 and 128 remain between adjacent rows and columns of first holes 120. In the embodiment shown, the first voids 114 are cylinder-shaped and are expanded to cuboid-shaped holes by the second etching process. It is, however, clear to those skilled in the art that the voids and holes may have a different cross-sectional shape. The same is true with respect to second voids and second holes subsequently explained with respect to FIGS. 11d to 11i.

Starting from the structure shown in FIG. 11e, a second hard mask 122 is applied to the top surface of substrate 110. The second hard mask 122 is shown in FIG. 11f at least partially transparent in order not to obscure the underlying structures.

A second photolithographic process is performed in order to generate second etching holes 124 through second hard mask 122, see FIG. 11g.

As shown in the top view (lower right portion) of FIG. 11g, the second etching holes 124 in second hard mask 122 are formed to be aligned with crossing points of ridges 126 and 128. In other words, the array of second etching holes 124 is offset when compared to the array of first holes 120. A third etching process through second etching holes 124 is performed in order to form second voids 130 in substrate 110. Generally, the second voids 130 are formed to the same depth as the first holes 120. Since the second voids 130 are formed through the second etching holes 124, same are formed in a regular array in the crossing points of ridges 126 and 128. Upon the third etching process, second hard mask 122 is stripped and the structure shown in FIG. 11h is obtained. The second etching process may comprise a plasma-etching process such as a reactive ion etching process.

Thereupon, a fourth etching process is performed in order to expand the second voids 130 to obtain second holes 140 within the substrate 110. As can be seen from FIG. 11e, second holes 140 extend to the same depth as first holes 120. The second holes are formed to abut to the first holes such that microstructures 142 are formed between adjacent ones of the first holes 120 and the second holes 140. To be more specific, corners of the second holes 140 abut to corners of the first holes 120. It goes without saying that the second holes 140 may be formed to overlap the first holes 120, such that the microstructures 142 are formed between the adjacent ones of first holes 120 and second holes 140. In the embodiment shown, cuboid-shaped microstructures 142 remain after the fourth etching process. As the second etching process, the fourth etching process may be an anisotropic etching process, such as a so-called wet bottle etch process.

Figure 11J:
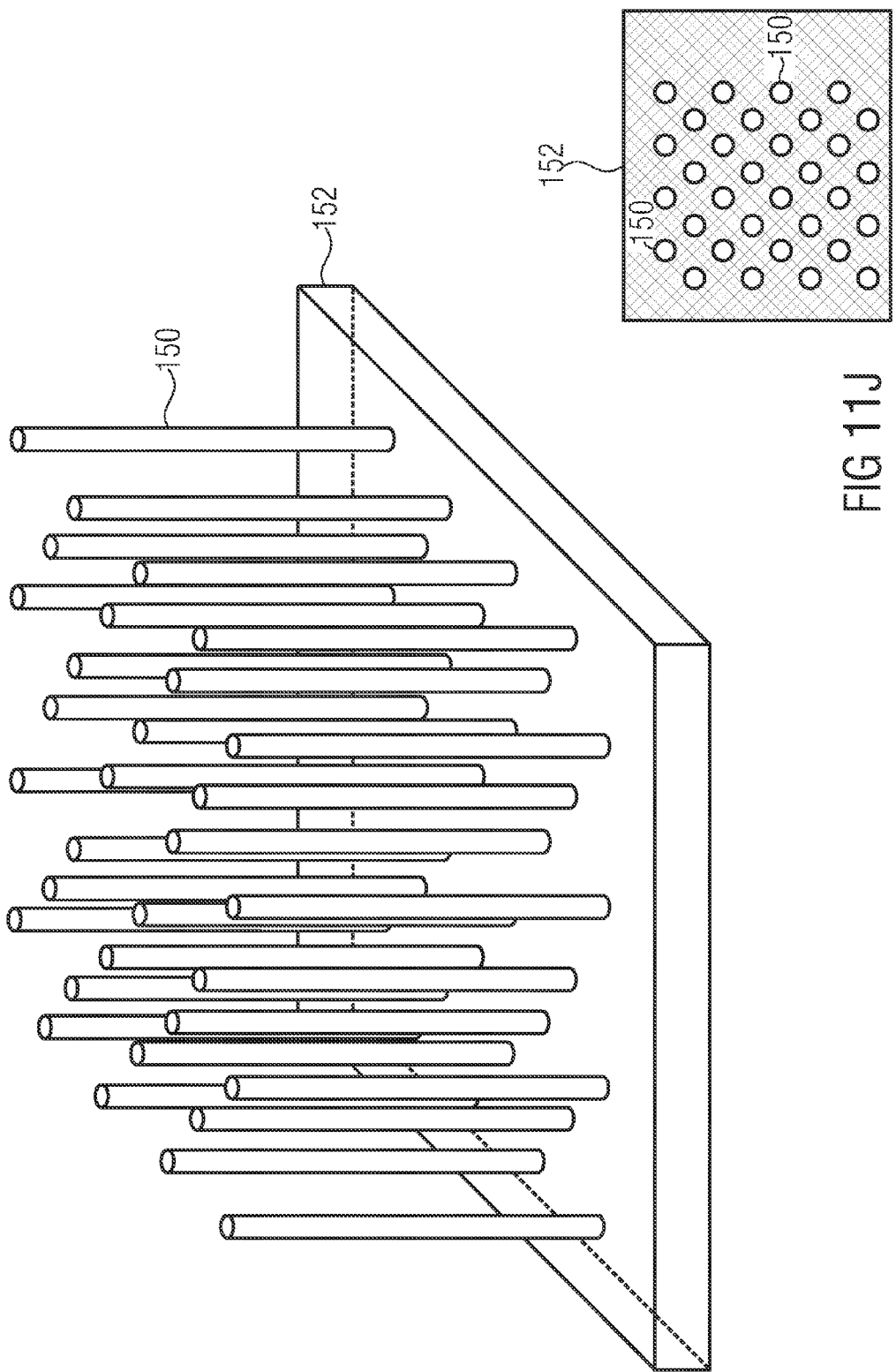

In the embodiment shown, after the fourth etching process, a fifth etch process is performed after the fourth etch process in order to obtain the resulting shape of microstructures shown in FIG. 11j. The lower portion of substrate 110 remains as support 152. In the embodiments shown, microstructures 150 have a substantially cylindrical shape. The fifth etching process may be an isotropic wet etching process. The second and fourth etching processes may be anisotropic wet etching processes.

As shown in FIG. 11j, the resulting apparatus comprising an array of microstructures 150 extending from a support 152 comprises 32 microstructures. The 32 microstructures are obtained making use of a double-patterning, each patterning making use of a lithographic process and each lithographic process is providing 16 features. Double-patterning as described above results in microstructures, which have a distance, which is lower than otherwise possible using a single lithographic process. Accordingly, embodiments permit for the generation of an array of closely spaced microstructures, which extend from a support.

In the described embodiments, the microstructures, such as the elongate bendable and conductive pins, comprise a cylindrical form. In other embodiments, the microstructures may comprise any conceivable cross-sectional form, such as an oval cross-sectional form, a rectangular cross-sectional form or the like, as long as the respective conductive microstructures remain bendable as described above. In the embodiments, the dimension of the bendable and conductive microstructures are such that they are held together by means of van der Waals forces upon being brought into mechanical contact with each other.

Accordingly, embodiments provide for micromechanical structures appropriate to define a first state or a second state, wherein embodiments provide for switches and permanent storage devices using such structures. Embodiments provide for methods of adjusting or programming an apparatus comprising such structures and embodiments provide for a method for manufacturing such structures.

Although some aspects have been described in the context of an apparatus, it is clear that these aspects also represent a description of the corresponding method, where a block or device corresponds to a method step or features of a method step. Analogously, aspects described in the context of a method step also represent a description of a corresponding block or item or feature of a corresponding apparatus.

The above-described embodiments are merely illustrative for the principles of the present invention. It is understood that modifications and variations of the arrangement and the details described herein will be apparent to those skilled in the art. It is the intent, therefore, to be limited only by the scope of the appended claims and not by the specific details presented by way of description and explanation of the embodiments herein.

What is claimed is:

1. An apparatus comprising:
   a support; and
   a plurality of bendable and conductive microstructures extending from the support,
   wherein two adjacent microstructures of the plurality of microstructures define a detectable first state if they are not bent such that end portions thereof, which are distal with respect to the support, do not touch each other, and
   wherein the two adjacent microstructures of the plurality of microstructures define a detectable second state if they are bent such that the end portions thereof touch each other and are fixed to each other, and
   wherein respective groups of x+1 microstructures of the plurality of microstructures form x-bit cells of a memory device, which are capable of storing x bits, wherein x is a natural number and wherein an x-bit value stored in a corresponding bit cell depends on which of adjacent microstructures of the respective group are in the first state and which of the adjacent microstructures of the respective group are in the second state.

2. The apparatus of claim 1, comprising read contacts configured to detect the first state or the second state.

3. The apparatus of claim 2, wherein the read contacts are arranged to contact the distal end portions of microstructures, which define one of the first state and the second state, and are arranged not to contact the distal end portions of microstructures, which define the other one of the first state and the second state.

4. The apparatus of claim 1, wherein x is two and wherein the microstructures of a group are arranged in a row or are arranged on vertices of a triangle.

5. The apparatus of claim 1, wherein x is three and wherein the microstructures of a group are arranged on corners of a square.

6. The apparatus of claim 1, wherein x is four and wherein the microstructures of a group are arranged on corners of a square and in s center of the square.

7. The apparatus of claim 1, wherein the adjacent microstructures of the plurality of microstructures defining the detectable second state are fixed to each other by van der Waals' forces.

8. The apparatus of claim 1, wherein the plurality of microstructures is at least partially embedded in an embedding material in order to fix the plurality of microstructures in their respective states.

9. The apparatus of claim 1, wherein the plurality of microstructures are arranged in a regular array of rows and columns of microstructures.

10. The apparatus of claim 9, wherein the microstructures are arranged such that, except for outermost microstructures, distances between each microstructure and each of four nearest neighbors of the microstructure are substantially identical.

11. A permanent storage device comprising:
a support; and
a plurality of bendable and conductive microstructures extending from the support, wherein adjacent microstructures of the plurality of microstructures are bendable such that end portions thereof, which are distal with respect to the support, touch each other, wherein respective groups of x+1 microstructures of the plurality of microstructures form x-bit cells of the permanent storage, which are capable of storing x bits, wherein x is a natural number and wherein an x-bit value stored in a corresponding bit cell depends on which of adjacent microstructures of the respective group touch each other and which of the adjacent microstructures of the respective group do not touch each other; and
read contacts configured to allow a detection of which of the adjacent microstructures of the respective group touch each other and to derive the x-bit value based thereon.

12. A method of adjusting an apparatus comprising a support and a plurality of bendable and conductive microstructures extending from the support to define a first state or a second state, the method comprising:
not bending two adjacent microstructures of the plurality of microstructures such that end portions thereof, which are distal with respect the support, do not touch each other to define the first state; and
bending two other adjacent microstructures of the plurality of microstructures such that the end portions thereof touch each other and are fixed to each other to define the second state, wherein respective groups of x+1 microstructures of the plurality of microstructures form x-bit cells of a memory device, which are capable of storing x bits, wherein x is a natural number and wherein an x-bit value stored in a corresponding bit cell, the method comprising differently bending adjacent microstructures within different x-bit cells in order to store different x-bit values in the different x-bit cells.

13. The method of claim 12, wherein the apparatus is a permanent storage device and wherein defining the first state comprises storing a first value and defining the second state comprises storing a second value.

14. The method of claim 12, wherein bending the two adjacent microstructures of the plurality of microstructures comprises applying charges to the microstructures in order to bend them towards each other, wherein the distal end portions thereof are fixed to each other by van der Waals' forces.

15. The method of claim 14, wherein applying charges comprises applying charges using methods of scanning probe microscopy.

16. The method of claim 12, further comprising mechanically fixing the plurality of microstructures in their respective states by at least partially embedding the microstructures in an embedding material.

17. A method for manufacturing an apparatus comprising an array of microstructures extending from a support, the method comprising:
forming a plurality of first holes in a substrate, wherein the first holes are arranged in rows and columns of a regular array, wherein ridges remain between adjacent rows and columns of the regular array; and
forming a plurality of second holes in crossing points of the ridges, such that the second holes are arranged in rows and columns of a regular array,
wherein the first and second holes abut to each other or overlap such that the microstructures are formed between adjacent ones of the first holes and adjacent ones of the second holes.

18. The method of claim 17, wherein forming the plurality of first holes comprises a first etching process to form first voids in the substrate using a first etching mask comprising first etching openings and performing a second etching process to expand the first voids to generate the first holes.

19. The method of claim 18, wherein forming the plurality of second holes comprises a third etching process to form second voids in the substrate using a second etching mask comprising second etching openings and performing a forth etching process to expand the second voids to generate the second holes.

20. The method of claim 19, comprising a fifth etching process to bring the microstructures to a final shape.

21. The method of claim 19, comprising a first photolithographic process to generate the first etching mask and a second photolithographic process to generate the second etching mask.

* * * * *